(12) United States Patent
Shany et al.

(10) Patent No.: US 10,686,471 B2
(45) Date of Patent: Jun. 16, 2020

(54) ONE-SUB-SYMBOL LINEAR REPAIR SCHEMES

(71) Applicant: SAMSUNG ELECTRONICS CO., LTD., Suwon-Si, Gyeonggi-Do (KR)

(72) Inventors: Yaron Shany, Kfar Saba (IR); Jun Jin Kong, Yongin-Si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 150 days.

(21) Appl. No.: 15/821,480

(22) Filed: Nov. 22, 2017

(65) Prior Publication Data
US 2019/0158119 A1 May 23, 2019

(51) Int. Cl.
| H03M 13/00 | (2006.01) |
| H03M 13/15 | (2006.01) |
| H03M 13/29 | (2006.01) |
| H03M 13/37 | (2006.01) |
| G06F 11/10 | (2006.01) |

(52) U.S. Cl.
CPC ....... *H03M 13/154* (2013.01); *H03M 13/157* (2013.01); *H03M 13/158* (2013.01); *H03M 13/1515* (2013.01); *H03M 13/29* (2013.01); *H03M 13/373* (2013.01); *G06F 11/108* (2013.01)

(58) Field of Classification Search
CPC ........... H03M 13/154; H03M 13/1515; H03M 13/158; H03M 13/157; H03M 13/29
See application file for complete search history.

(56) References Cited

U.S. PATENT DOCUMENTS

| 7,421,044 B2 | 9/2008 | Cameron et al. |
| 7,487,429 B2 | 2/2009 | Baggen |
| 8,103,943 B2 | 1/2012 | Lablans |
| 8,433,979 B2 * | 4/2013 | Blaum ................. G06F 11/108 714/770 |
| 9,287,897 B2 | 3/2016 | Shen et al. |

(Continued)

OTHER PUBLICATIONS

Zeev Dvir, et al., "Extensions to the Method of Multiplicities, With Applications to Kakeva Sets and Mergers," Foundations of Computer Science, 2009. FOC '09. 50th Annual IEEE Symposium on, Mar. 2010M pp. 1-26.

(Continued)

*Primary Examiner* — Samir W Rizk
(74) *Attorney, Agent, or Firm* — F. Chau & Associates, LLC

(57) ABSTRACT

A method for repairing a single erasure in a Reed Solomon code in a system of a plurality of n storage nodes and a controller, wherein a content of each storage node is a codeword and each node stores a vector v. The method includes identifying a failed storage node; transmitting an index of the failed storage node to each surviving storage node; multiplying the content of each node i by a j-th component of a vector that is a permutation of elements of vector v that correspond to the surviving storage nodes; determining a trace map of the result and converting the result from an m×r bit representation into a reduced representation of r bits; reconstructing the content of the failed storage node from the reduced representation of each surviving node's content; and outputting the reconstructed content of the failed storage node.

20 Claims, 5 Drawing Sheets

(56) References Cited

U.S. PATENT DOCUMENTS

| | | |
|---|---|---|
| 9,344,117 B2 | 5/2016 | Mula et al. |
| 9,489,252 B1 | 11/2016 | Donlan |
| 2008/0282128 A1 | 11/2008 | Lee et al. |
| 2012/0023385 A1* | 1/2012 | Scouarnec ........ H03M 13/3761 |
| | | 714/763 |
| 2015/0303949 A1* | 10/2015 | Jafarkhani .......... H03M 13/617 |
| | | 714/764 |
| 2015/0347231 A1 | 12/2015 | Gopal et al. |
| 2018/0039543 A1* | 2/2018 | Luby ..................... G06F 3/0659 |

OTHER PUBLICATIONS

Venkatesan Guruswami, et al., "Repairing Reed-Solomon Codes," IEEE Transactions on Information Theory ( vol. 63, Issue: 9, Sep. 2017, pp. 1-25.

Henning Stichtenoth, "On the Dimension of Subfield Subcodes," IEEE Transactions of Information Theory, vol. 36, No. 1, Jan., 1990, pp. 90-93.

K. V. Rashmi, et al., "A "Hitchhiker's" Guide to Fast and Efficient Data Reconstruction in Erasure-Coded Data Centers," SIGCOMM '14 Proceedings of the 2014 ACM conference on SIGCOMM pp. 331-342.

* cited by examiner

To FIG. 1B

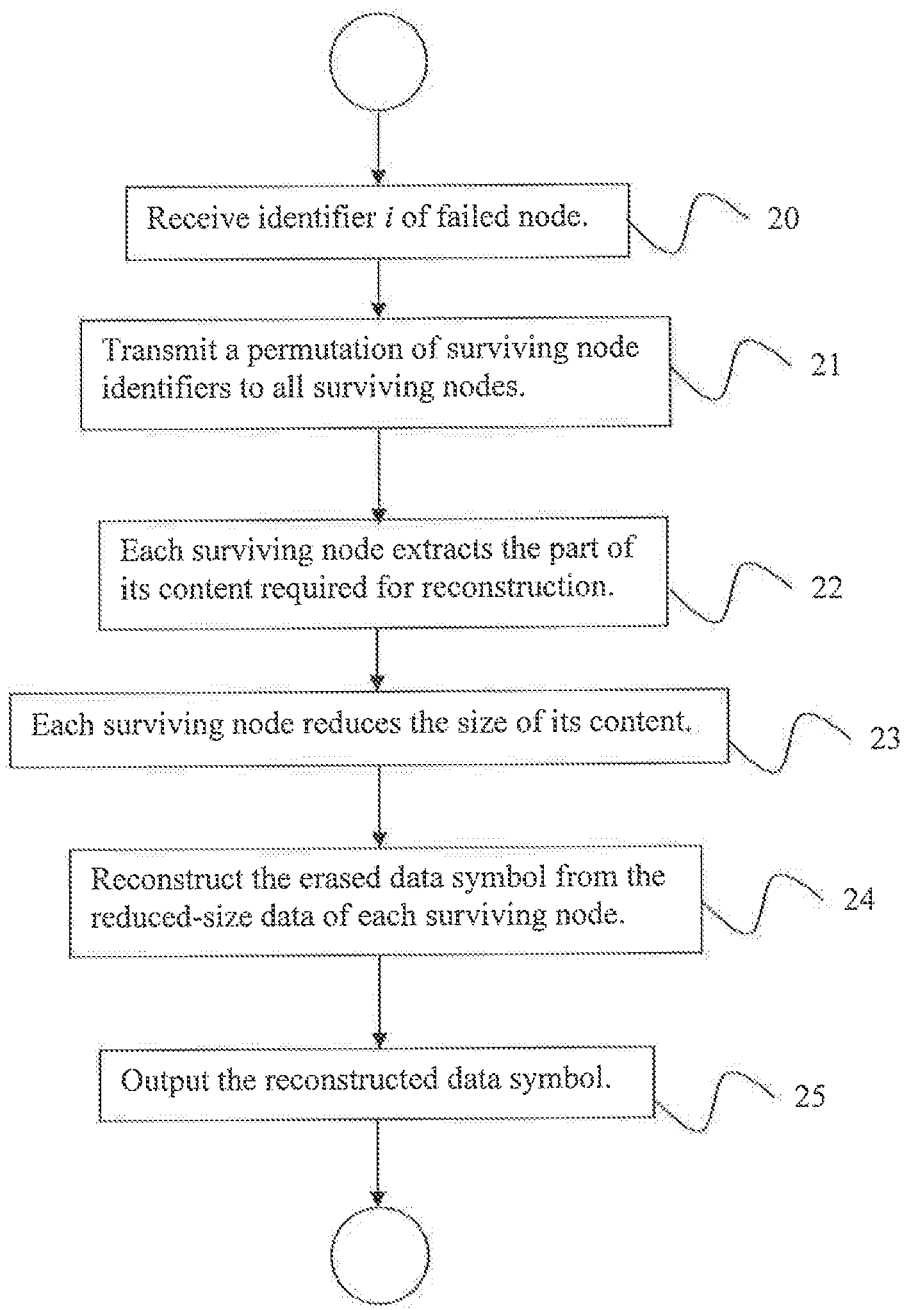

ONE-SUB-SYMBOL LINEAR REPAIR SCHEMES

BACKGROUND

Technical Field

Embodiments of the present disclosure are directed to methods of repairing corrupted digital data.

Discussion of the Related Art

In coding theory, Reed-Solomon (RS) codes form a class of error-correcting codes (ECCs) that are constructed using finite fields. RS codes can be defined as follows. Let q be a prime power, and let $\mathbb{F}_q$ be the finite field of q elements. For a subset $I \subseteq \mathbb{F}_q$, an enumeration $I := \{x_1, \ldots, x_n\}$ of I, with $n := |I|$, and a positive integer $k \leq n$, the RS code with evaluation set I and dimension k is defined as the set of length-n vectors in $\mathbb{F}_q^n$ obtained by evaluating all polynomials $f(X) \in \mathbb{F}_q[X]$ of degree up to k−1 on the points of I. Exlplicitly, the RS code with evaluation set I and dimension k is defined as $$\{(f(x_1), \ldots, f(x_n)) | f \in \mathbb{F}_q[x], \deg(f) \leq k-1\}.$$

RS codes allow a precise control over the number of symbol erasures correctable by the code during code design. In particular, it is possible to design RS codes that can correct multiple symbol erasures.

A generalized RS (GRS) code is obtained by coordinate-wise multiplication of all codewords of an RS code of length n by the entries of some pre-defined vector $(a_1, \ldots, a_n)$ with non-zero entries in the same field over which the RS code is defined. Erasure decoding of a GRS code can be reduced to that of an RS code by the following steps: (1) Each surviving node divides its content by the corresponding $a_i$; (2) The system performs RS erasure decoding, possibly with low-bandwidth in case of a single erasure; and (3) The reconstructed RS symbols are multiplied by the corresponding $a_i$ in order to be converted to the required reconstructed US symbols.

An exemplary application of RS codes is encoding stored data. For example, a host may write incoming messages to a storage array of unreliable "nodes". According to an embodiment, a node includes memory and some processing capability. In a flash array, a node may include an individual SSD with or without an "augmented" controller for performing, e.g., the encoding calculations on top of the usual tasks performed by an individual SSD controller. Alternatively, in cloud storage, a node may be, e.g., a computer with one or more drives.

The incoming messages are the data that users would like to store, and are free to take any value. An actual stored message, such as a movie, can be of various sizes, but from a coding point of view, what is important are the encoded chunks, sometimes called "stripes". A stripe includes information symbols and parity symbols.

To achieve reliable storage, the host encodes the data before storing it. Then, if one or more storage nodes fails, the host has to restore (decode) the lost data. Note that whether or not the user wishes to read his/her stored data, the host may correct erasures as they are discovered, by, e.g., a scanning mechanism that constantly searches for failed nodes. In a typical case, the encoding process introduces enough redundancy to overcome more than a single failure. However, the most common case of failure is that of a single failure (erasure), for which embodiments of disclosure provide a low-bandwidth decoding algorithm as described below.

An approximate conceptual description of an exemplary system operation is as follows. Note that to keep this example concrete, it will consider a cloud storage setup, but there are also other potential scenarios, e.g., that of a flash array, i.e., a "super disk" constructed from several individual solid-state, drives, SSDs, typically placed on a rack.

Storage:
1. A user uploads a file, such as a movie, for cloud storage.
2. The cloud host stores the movie. For reliable storage, the message is encoded by, e.g., an RS code. In typical systematic encoding, the encoded message consists of the original message +parity symbols. In actual practice, the (typically very large) message is broken into smaller chunks, and each chunk is encoded separately. For example, one cloud storage provider uses an RS encoding taking 10 8-bit symbols of information to a codeword of 14 8-bit symbols, with 10 symbols of information+4 symbols of parity in systematic encoding. So, the original message is broken into chunks of 10 8-bit symbols, and each chunk is encoded individually.
3. The host stores each RS symbol in a different individual drive. For example, in the above $(14, 10)_{\mathbb{F}_{2^8}}$ example, the 14 coded symbols are stored in 14 different drives.

Maintenance:
1. Suppose that a failure is detected, either by some scanning software that searches for failures, or because a user tried to read the data and got a failure indication.
2. Continuing with the $(14, 10)_{\mathbb{F}_{2^8}}$ example, if up to 4 drives failed, the host restores the 4 missing symbols. For the restoring process, the host needs the following data:
   (i) if the number of failed drives is between 2 and 4, then for restoring the missing data, 10 of the surviving nodes have to transmit to the host their entire content.
   (ii) If a single drive fails, then in one of the applications of the current invention, each one of the 13 surviving drives has to transmit only ½ of its content to the host.
3. The restored data may be, e.g., re-stored on different nodes, or just sent to the user.

SUMMARY

According to an embodiment of the disclosure, there is provided a method for repairing a single erasure in an RS code over a finite field $F_2^{mr}$ with an evaluation set $V = \{u_0 = 0, u_1, \ldots, u_{n-1}\}$ that is a subspace of size $n = 2^d$, for $d < mr$ and divisible by m, wherein a normalized repair bandwidth $\bar{b} \approx (n-1)/m$ in and a number of information symbols is $k \leq 2^d - 2^{d-d/m}$, in a system of a plurality of n storage nodes and a controller, wherein a content $c_i$ of each storage node i is an element of the finite field $F_2^{mr}$ and each node stores a vector v whose entries are inverses of non-zero elements of the evaluation set V. The method includes identifying, by the controller, a failed storage node; transmitting, by the controller, an index $j_0$ of the failed storage node to each surviving storage node; multiplying, by each surviving storage node i, the content $c_i$ of each said node i by a j-th component of vector w(i) wherein $$j = j(i, j_0) = \begin{cases} j_0 & \text{if } j_0 < i \\ j_0 - 1 & \text{if } j_0 > i \end{cases},$$

wherein $w(i)_{j(i,j_0)}:=v_{j'}$ for all $i \in \{0, \ldots, j_0-1, j_0+1, \ldots, n\}$ is a permutation of elements of vector v that correspond to the surviving storage nodes, wherein j' is a unique index in $\{1, \ldots, n-1\}$ such that $u_{j'}=u_{j_0}+u_i$; determining a trace map of a result $out_i$ of said multiplication and converting, by each surviving storage node, the result from an m×r bit representation into a reduced representation $\widetilde{out}_i$ of r bits; reconstructing, by the controller, content of the failed storage node from the reduced representation of each surviving node's content; and outputting the reconstructed content of the failed storage node.

According to a further embodiment of the disclosure, j' is calculated by the controller, and transmitted to the surviving storage nodes.

According to a further embodiment of the disclosure, each surviving storage node calculates j' based on an index of each surviving storage node and an index of the failed storage node.

According to a further embodiment of the disclosure, j' is pre-calculated for each storage node.

According to a further embodiment of the disclosure, multiplying, by each surviving storage node i, the content $c_i$ of each said node i by a j-th component of vector $w(i)$ comprises calculating, by each node i, $i \neq j_0$, wherein $j_0$ is the identifier of the failed node, $out_i := Tr(w(i)_{j(i,j_0)} \cdot c_i) = \sum_{a=0}^{m-1} (w(i)_{j(i,j_0)} \cdot c_i)^{2^{ar}}$.

According to a further embodiment of the disclosure, convening the result from an m×r bit representation into a reduced representation of r bits comprises, when elements of field $F_{2^{mr}}$ are represented as length-m vectors in vector space $(F_{2^r})^m$ according to a basis 1, α, ..., $α^{m-1}$ of $F_{2^{mr}}$ over $F_{2^r}$, transmitting, by each node node i, $i \neq j_0$, the first coordinate of $out_i$ to the controller.

According to a further embodiment of the disclosure, converting the result from an m×r bit representation into a reduced representation of r bits comprises, when elements of field $F_{2^{mr}}$ are represented as length-mr vectors of bits in vector space $F_2^{mr}$ according to a basis 1, α, ..., $α^{mr-1}$ of $F_{2^{mr}}$ over $F_2$, wherein α is a primitive element of field $F_{2^{mr}}$, and transmitting, by each node i, $i \neq j_0$, a product $M \cdot out_i$ to the controller, wherein matrix $M \in F_2^{r \times mr}$.

According to a further embodiment of the disclosure, matrix $M \in F_2^{r \times mr}$ is r rows of a matrix $T \in F_2^{r \times mr}$ with indices supporting an r×r identity matrix in $TM_1$, wherein $M_1 \in F_2^{mr \times r}$ is a matrix whose j-th column, j=0, ..., m-1 is a length-mr binary representation of $β^j$ according to a basis $\{1, α, \ldots, α^{mr-1}\}$ of field E over field $F_2$, $E:=F_{2^{mr}}$, and β is a primitive element of field $F_{2^{mr}}=F$.

According to a further embodiment of the disclosure, reconstructing content of the failed storage node from the reduced representation of each surviving node's content includes the steps of calculating $t^T=(t_1, \ldots, t_m)^T:=A'z^T \in (F')^m$ using a matrix $A' \in (F')^{m \times (n-1)}$, wherein $F':=F_2[X]/(P_1(X))$, wherein $p_1(X)$ is a minimal polynomial of β, wherein vector $z:=(z_1, \ldots, z_{n-1}) \in (F')^{n-1}$ wherein $z_a:=\widetilde{out}_i$ for all $a=1, \ldots, n-1$ and for $i \neq j_0$ for which j'=a, wherein n is a total number of storage nodes and $\widetilde{out}_i$ is the reduced representation of surviving node i's content; wherein matrix A' is a matrix obtained by replacing each entry $a_{ij}$ of A by $Ma_{ij}$ when $a_{ij}$ is regarded as a column vector in $F_2^{mr}$ according a basis $\{1, α, \ldots, α^{mr-1}\}$ of $F_{2^{mr}}$ over $F_2$, wherein matrix $A \in F^{m \times (n-1)}$ is a matrix with rows $c_1, \ldots, c_m$ that are m linearly independent vectors $\in F^{n-1}$ that complete a basis of C" to be a basis of C', wherein $C':=\{c \in F^{n-1} | H'c^T = 0\}$, the F-subfield subcode of the code with parity-check matrix H', and $C'':=\{c \in F^{n-1} | H''c^t = 0\}$, the F-subfield subcode of the code with parity-check matrix H", wherein $$H'' \in E^{k \times (n-1)} := \begin{pmatrix} v \\ H' \end{pmatrix}, H' \in E^{(k-1) \times (n-1)} := G' \cdot \begin{pmatrix} v_1 & & \\ & \ddots & \\ & & v_{n-1} \end{pmatrix},$$

$$G' \in E^{(k-1) \times (n-1)} := \begin{pmatrix} u_1 & \cdots & u_{n-1} \\ u_1^2 & \cdots & u_{n-1}^2 \\ \vdots & \ddots & \vdots \\ u_1^{k-1} & \cdots & u_{n-1}^{k-1} \end{pmatrix}, (v_l, \ldots, v_{n-l})$$

are elements of vector v, and $(u_1, \ldots, u_{n-1})$ are non-zero elements of evaluation set V, and wherein matrix $M \in F_2^{r \times mr}$ is r rows of a matrix $T \in F_2^{mr \times mr}$ with indices supporting an r×r is identity matrix in $TM_1$, wherein $M_1 \in F_2^{mr \times r}$ is a matrix whose j-th column, j=0, ..., m-1, is the length-mr binary representation of $β^j$ according to the basis $\{1, α, \ldots, α^{mr-1}\}$ of E over $F_2$, wherein β is a primitive element of field $F_{2^r}=F$ and α is a primitive element of field $F_{2^{mr}}$; embedding elements $t \in (F')^m$ in field $E:=F_{2^{mr}}$ to obtain a vector $w \in F^m$; and restoring the content of the failed storage node by calculating $y_i = \sum_{a=1}^m w_a x_a$, wherein $\{x_1, \ldots, x_m\} \subset E$ form a dual basis for E over F with respect to a basis whose elements are entries of vector $y=(y_1, \ldots, y_m)^T := Av^T \in E^m$.

According to a further embodiment of the disclosure, embedding elements of $t \in (F')^m$ in E to obtain a vector $w \in F^m$ includes calculating $w_a := M_1 \cdot t_a$ for $a=1, \ldots, m$, wherein each coordinate $t_a$ of t is represented as a length-r binary column vector according to the basis 1, β', ..., $(β')^{r-1}$ of F' over $F_2$, and outputting $w := (w_1, \ldots, w_m)$, wherein each entry of w is a vector representation of an element of E, according to the basis $\{1, α, \ldots, α^{mr-1}\}$.

According to another embodiment of the disclosure, there is provided a non-transitory program storage device readable by a computer, tangibly embodying a program of instructions executed by the computer to perform the method steps for repairing a single erasure in an RS code over a finite field $F_2^{mr}$ with an evaluation set $V=\{u_0=0, u_1, \ldots, u_{n-1}\}$ that is a subspace of size $n=2^d$, for d<mr and divisible by m, wherein a normalized repair bandwidth $\bar{b} \approx (n-1)/m$ and a number of information symbols is $k \leq 2^d - 2^{d-d/m}$, in a system of a plurality of n storage nodes and a controller, wherein content $c_i$ of each storage node i is an element of the finite field $F_2^{mr}$ and each node stores a vector v whose entries are inverses of non-zero elements of the evaluation set V.

BRIEF DESCRIPTION OF THE DRAWINGS

FIG. 2 is a flowchart of an online part of an algorithm for repairing corrupted Reed-Solomon codes according to embodiments of the disclosure.

DETAILED DESCRIPTION OF EXEMPLARY EMBODIMENTS

Figure 1A:
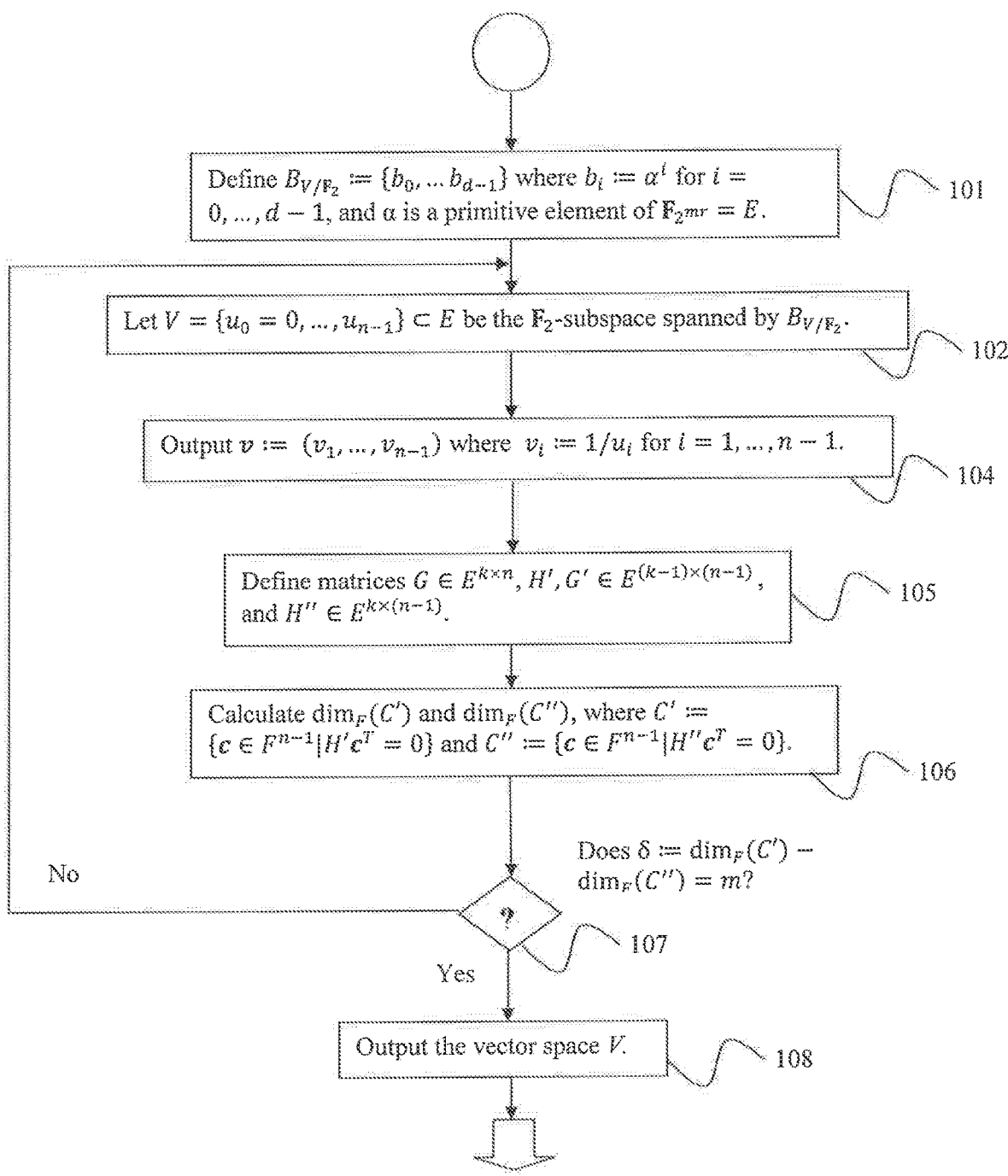
FIGS. 1A-B is a flowchart of an offline part of an algorithm for repairing corrupted Reed-Solomon codes, according, to embodiments of the disclosure.

Exemplary embodiments of the invention as described herein generally provide systems and methods for repairing corrupted Reed-Solomon codes. While embodiments are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Herein, when two or more elements are described as being about the same as each other, such as A≈B, it is to be understood that the elements are identical to each other, indistinguishable from each other, or distinguishable from each other but functionally the same as each other as would be understood by a person having, ordinary skill in the art.

1. Overview

It was recently shown by V. Guruswami and M. Wootters, "Repairing Reed-Solomon. Codes", arXiv:1509.04764v1, the contents of which are herein incorporated by reference in their entirety, hereinafter Guruswami, that if C is a Reed-Solomon code of length n:=$q^m$ over $\mathbb{F}_{q^m}$, where q is a prime power, and m∈ℕ, and n−dim(C)≥n/q, then any erased coordinate in C can be repaired by "transmitting" only one $\mathbb{F}_q$-element from each one of the non-erased coordinates. Embodiments of the disclosure consider such simple repair schemes: $\mathbb{F}_q$-linear repair schemes in which repairing a single erased coordinate in an $\mathbb{F}_{q^m}$-linear code requires transmitting at most one $\mathbb{F}_q$-symbol from each non-erased coordinate.

According to embodiments, a necessary and sufficient condition for a code to have a simple repair scheme is provided. A condition according to an embodiment is closely related to the task of finding the dimension of subfield-subcodes. In the case where the code to be repaired is a Reed-Solomon code, a condition according to an embodiment is closely related to the task of calculating the dimension of alterant codes. As a first application of the condition, it is used to re-prove the above result of Guruswami.

According to embodiments, the case of Reed-Solomon codes over $\mathbb{F}_{2^{2r}}$ with an evaluation set hat is an $\mathbb{F}_2$-subspace of $\mathbb{F}_{2^{2r}}$ is considered. Here, q=$2^r$, while m=2. In this context, it is shown that for all even d≥4, if r≥d−1+$\log_2(d)$, then there exists a d-dimensional $\mathbb{F}_2$-subspace U of $\mathbb{F}_{2^{2r}}$ such that the $[2^d, 2^d-2^{d/2}]_{\mathbb{F}_{2^{2r}}}$ Reed-Solomon code defined on U has a simple repair scheme.

For the special case where d=4, it is shown that for all r≥2, there exists an appropriate $\mathbb{F}_2$-subspace U⊆$\mathbb{F}_{2^{2r}}$ such that the $[16, 12]_{\mathbb{F}_{2^{2r}}}$ Reed-Solomon code defined on U has a simple repair scheme. Shortening such a $[16,12]_{\mathbb{F}_{2^8}}$ code, a $[14,10]_{\mathbb{F}_{2^8}}$ shortened Reed-Solomon code is obtained that requires reading a total of only 52 bits for repairing any single erased coordinate. Note that in the best existing repairing scheme for the $[14,10]_{\mathbb{F}_{2^8}}$ Hadoop distributed file system (HDFS) code, repairing a single erased coordinate requires reading a total of 64 or 60 bits, depending on the erased coordinate, from the non-erased coordinates. In addition, the "Hitchhiker-nonXOR" code of Rashmi et al., "A 'Hitchhiker's' Guide to Fast and Efficient Data Reconstruction in Erasure coded Data Centers", SIGCOMM'14, Aug. 17-22, 2014, Chicago, USA, the contents of which are herein incorporated by reference in their entirety, achieves the same saving in repair bandwidth as a code according to embodiments, but only for the 10 information coordinates, and at the cost of coupling pairs of bytes.

In addition to the above case of of Reed-Solomon codes over $\mathbb{F}_{2^{2r}}$, for which there is a proof that many subspaces result in a simple repair scheme for any r and even d, as long as the dimension k satisfies k≥$2^d-2^{d/2}$, embodiments of the disclosure also consider the case of Reed-Solomon codes over $\mathbb{F}_{2^{mr}}$ for m>2. For this case, there exist some concrete examples of subspaces U of dimension d divisible by m, such that for an RS code of dimension $$k \leq 2^d - 2^{d-\frac{d}{m}}$$

with evaluation set U, there is a simple $\mathbb{F}_{2^r}$-linear repair scheme. With such a scheme, when a single node fails, the surviving nodes need transmit only 1/m of their content to restore the failed node.

2. Preliminaries

Throughout this disclosure, q is a prime power and m∈ℕ*. If F is a field and M∈$F^{r\times n}$, for r, n∈ℕ 8, then ker(M) represents the kernel of the map $F^n \to F^r$ defined by x↦Mx. If F is a finite field, then for k, n∈ℕ, an [n, k]$_F$ code is an F-linear code of dimension k in $F^n$.

2.1. The Trace Map

Definition 2.1: The trace map, Tr=$Tr_{\mathbb{F}_{q^m}/\mathbb{F}_q}:\mathbb{F}_{2^m}\to\mathbb{F}_q$, is defined by $$Tr(x) := x + \sigma(x) + \sigma^2(x) + \ldots + \sigma^{m-1}(x),$$
$$= x + x^q + x^{q^2} + \ldots + x^{q^{m-1}},$$

where τ:x↦$x^q$ is the Frobenius automorphism of $\mathbb{F}_{q^m}$ over $\mathbb{F}_q$. For x, Y∈$\mathbb{F}_{q^m}$, the notation x·$_{Tr}$y:=Tr(xy) will be used. In addition, for x∈$\mathbb{F}_{q^m}$ and y=($y_0, \ldots, y_{n-1}$)∈$\mathbb{F}_{q^m}^n$ for some n∈ℕ*, write $x·_{Tr}y:=(x·_{Tr}y_0, \ldots, x·_{Tr}y_{n-1})\in\mathbb{F}_q^n$ and similarly for column vectors, Since a polynomial of degree $q^{m-1}$ cannot have $q^m$ roots, the trace is not identically zero, and hence (x, y)↦Tr(xy)= x·$_{Tr}$y is a non-degenerate symmetric $\mathbb{F}_q$-bilinear form. As usual in this case of finite dimension, the map φ:x↦ (y↦x·$_{Tr}$y) is an isomorphism of $\mathbb{F}_q$-vector spaces between $\mathbb{F}_{q^m}$ and its dual space.

Let $b_1, \ldots, b_m$ be a basis of $\mathbb{F}_{q^m}$ over $\mathbb{F}_q$. The elements $b'_1, \ldots, b'_m$ that map under φ to the dual basis of $b_1, \ldots, b_m$ are referred to as the trace-dual basis of $b_1, \ldots, b_m$. By definition, $b_i·_{Tr}b'_j=1_{(i=j)}$, so that if x∈$\mathbb{F}_{q^m}$ is represented as x=$\Sigma_i a_i b_i$ with $a_i\in\mathbb{F}_q$ for all i, then for all i, $a_i$=x·$_{Tr}$b'$_i$.

Remark 2.2 Note that for all x,y,z∈$\mathbb{F}_{q^m}$, (xy)·$_{Tr}$z=x·$_{Tr}$(yz).

2.2, Linear Repair Schemes

Linear repair schemes are defined in Guruswami, incorporated by reference above, as follows.

Definition 2.3 Let n∈ℕ*, let C⊂$\mathbb{F}_{q^m}^n$ be a linear code, and let i∈{0, ..., n−1}. An $\mathbb{F}_q$-linear repair scheme for coordinate i of C comprises:

1. For all j∈{0, ..., n−1}\{i}, a set $L_j$ of $\mathbb{F}_q$-linear functionals $\mathbb{F}_{q^m}\to\mathbb{F}_q$;
2. An $\mathbb{F}_q$-linear function $f$: $\mathbb{F}_q^{\Sigma_{j\neq i}|L_j|}\to\mathbb{F}_{q^m}$, such that for all ($c_0, c_1, \ldots, c_{n-1}$)∈C:

$$c_i = f\left(\{f'(c_j)\}_{\substack{j\neq i \\ f'\in L_j}}\right).$$

The repair bandwidth $b_i$ of the above repair scheme for coordinate i of C is defined as $b_i$:=$\log_2(q)·\Sigma_{j\neq i}|L_j|$. This is the total number of bits that have to be read from the non-erased coordinates to restore the erased coordinate i. The normalized repair bandwidth $\bar{b}_i$ is the repair bandwidth divided by the number of bits stored in a single node.

If for all $j \neq i$, $|L_j| \leq 1$, then the linear repair scheme for coordinate i is simple.

So, in a simple linear repair scheme for coordinate i, at most 1 sub-symbol, i.e., a symbol from the subfield $\mathbb{F}_q$, has to be read from each non-erased coordinate to restore coordinate i. Hence, the repair bandwidth is not larger than $(n-1)\log_2(q)$.

Remark 2.4 If a linear code $C \subseteq \mathbb{F}_{q^n}^n$ has a transitive automorphism group, then the existence of a simple $\mathbb{F}_q$-linear repair scheme for some coordinate of C is equivalent to the existence of a simple $\mathbb{F}_q$-linear repair scheme for all coordinates. Recall that the automorphism group of C is the set Aut(C) of all permutations $\tau$ of $\{0, \ldots, n-1\}$ such that $\tau \cdot C = C$, where for $c = (c_0, \ldots, c_{n-1}) \in C$, the action of $\tau$ defined by $\tau \cdot c = (c_{\tau(0)}, \ldots, c_{\tau(n-1)})$, the group operation on Aut(C) is composition. Aut(C) is called transitive if for all i,j, there exists $\tau \in \text{Aut}(C)$ with $\tau(i)=j$. More generally, if there exists a linear repair scheme for some coordinate i of C and C has a transitive automorphism group, then the repair scheme can be permuted to become a linear repair scheme for any coordinate i'. In detail, let $\tau$ be an automorphism of C with $\tau(i)=i'$. By re-labeling the coordinates, the task of restoring coordinate i' of $(c_0, \ldots, c_{n-1}) \in C$ is transformed to the task of restoring coordinate i of $d := (c_{\tau(0)}, \ldots, c_{\tau(i)}, \ldots, c_{\tau(n-1)}) \in C$. So, using the notation of Definition 2.3, to restore coordinate i', for all $j \neq i (\Leftrightarrow \tau(j) \neq \tau(i) = i')$, node $\tau(j)$ should use the functionals from $L_j$ to calculate the sub-packets it transmits.

Remark 2.5 Suppose that a code C has a simple $\mathbb{F}_q$-linear repair scheme for some coordinate i. Then the same holds also for any subcode Consequently, if C has a simple repair scheme for all coordinates, so does any code obtained by shortening C.

3. The Repairing Theorem

According to an embodiment of the disclosure, a necessary and sufficient condition for the existence of a simple $\mathbb{F}_q$-linear repair scheme is presented. A result according to an embodiment of the disclosure is Theorem 3.2, which specifies a condition in terms of the dimensions of some sub field subcodes.

For a vector v, write diag(v) for the diagonal matrix with v on its main diagonal.

Lemma 3.1 For $n \in \mathbb{N}$, let $C \subseteq \mathbb{F}_{q^m}^n$ be a linear code of dimension k with the first coordinate not identically zero, so that C has a generator matrix of the form $$G := \begin{pmatrix} 1 & g_{01} & g_{02} & \cdots & g_{0,n-1} \\ 0 & g_{11} & g_{12} & \cdots & g_{1,n-1} \\ 0 & g_{21} & g_{22} & \cdots & g_{2,n-1} \\ \vdots & \vdots & \vdots & \ddots & \vdots \\ 0 & g_{k-1,1} & g_{k-1,2} & \cdots & g_{k-1,n-1} \end{pmatrix} =: \begin{pmatrix} 1 & g_0 \\ 0^T & G' \end{pmatrix}. \quad (1)$$

Then the code C has a simple $\mathbb{F}_q$-linear repair scheme for the first coordinate if and only if the following condition holds:

Condition (*): There exists a vector $v := (v_1, \ldots, v_{n-1}) \in \mathbb{F}_{q^m}^{n-1}$ such that, writing $C' \subseteq \mathbb{F}_q^{n-1}$ for the code with parity-check matrix $H' := G'\text{diag}(v)$, where $C'$ is the $\mathbb{F}_q$-subfield subcode of ker(H'), there exists an $\mathbb{F}_q$-linear subcode $D \subseteq C'$ with
(1) dim(D)=m and
(2) $D \cap \ker(g_0 \text{ diag}(v)) = \{0\}$.

Proof: A general codeword of C has the form $$c = (c_0, c_1, \ldots, c_{n-1}) := (x_0, x_1, \ldots, x_{k-1})G$$

for some $x_0, \ldots, x_{k-1} \in \mathbb{F}_{q^m}$. A task is to restore $c_0 = x_0$ from the known $c_1, \ldots, c_{n-1}$. For all $j \in \{1, \ldots, n-1\}$, there is $$c_j = g_{0j} x_0 + \sum_{i=1}^{k-1} g_{ij} x_i.$$

A general $\mathbb{F}_q$-linear functional of the form $v_j \cdot_{Tr}(-)$, for some $v_j \in \mathbb{F}_{q^m}$, can be applied to $c_j$ while recalling Remark 2.2, to get $$v_j \cdot_{Tr} c_j = (v_j g_{0j}) \cdot_{Tr} x_0 + \sum_{i=1}^{k-1} (v_j g_{ij}) \cdot_{Tr} x_i. \quad (2)$$

Collecting EQS. (2) for all $j \in (1, \ldots, n-1)$:

$$\{v_j \cdot_{Tr} c_j\}_{j=1}^{n-1} = x_0 \cdot_{Tr} \{v_j g_{0j}\}_{j=1}^{n-1} + \sum_{i=1}^{k-1} x_i \cdot_{Tr} \{v_j g_{ij}\}_{j=1}^{n-1}. \quad (3)$$

Because $\mathbb{F}_{q^m} \cong \mathbb{F}_q^m$ as an $\mathbb{F}_q$-vector space, the map $f$ of Definition 2.3 might as well have a codomain of $\mathbb{F}_q^m$. So, let $A \in \mathbb{F}_q^{m \times (n-1)}$, and consider the vector $$A \{v_j \cdot_{Tr} c_j\}_{j=1}^{n-1} = x_0 \cdot_{Tr} (A \{v_j g_{0j}\}_{j=1}^{n-1}) + \sum_{i=1}^{k-1} x_i \cdot_{Tr} (A \{v_j g_{ij}\}_{j=1}^{n-1}),$$

where the equality follows from EQ. (3) and the $\mathbb{F}_q$-bilinearity of $(-) \cdot_{Tr}(-)$, which implies that, for all i and all l:

$$(A \cdot (x_i \cdot_{Tr} \{v_j g_{ij}\}_j))_\ell = \text{row}_\ell(A) \cdot (x_i \cdot_{Tr} \{v_j g_{ij}\}_j)$$
$$= x_i \cdot_{Tr} (\text{row}_\ell(A) \cdot \{v_j g_{ij}\}_j) \text{ (bilinearity)}$$
$$= (x_i \cdot_{Tr} (A \cdot \{v_j g_{ij}\}_j))_\ell.$$

Because the $x_i$ are arbitrary, a necessary condition for reconstruction is that
(i) $\forall i \in \{1, \ldots, k-1\}$: $A \{v_j g_{ij}\}_{j=1}^{n-1} = 0$, and
(ii) The m elements of the vector $A \{v_j g_{0j}\}_{j=1}^{n-1} = A(g_0 \text{diag}(v))^T \in \mathbb{F}_{q^m}^m$ are $\mathbb{F}_q$-linearly independent, that is, these elements form a basis for $\mathbb{F}_{q^m}/\mathbb{F}_q$.

But (i) and (ii) is clearly also a sufficient condition: given (i), then $$A \{v_j \cdot_{Tr} c_j\}_{j=1}^{n-1} = x_0 \cdot_{Tr} (A \{v_j g_{0j}\}_{j=1}^{n-1}),$$

and given (ii), the elements of this vector are the coefficients in the description of $x_0$ as a linear combination of the elements of the dual of the basis in (ii). So, there exists a simple repair scheme for the first coordinate of C if there exist v and A such that conditions (i) and (ii) hold.

Note that condition (i) is equivalent to $$\begin{pmatrix} v_1 g_{11} & v_2 g_{12} & \cdots & v_{n-1} g_{1,n-1} \\ \vdots & \vdots & \ddots & \vdots \\ v_1 g_{k-1,1} & v_2 g_{k-1,2} & \cdots & v_{n-1} g_{k-1,n-1} \end{pmatrix} A^T = 0.$$

Recalling that $H' := G' \text{diag}(v)$, it can be seen that condition (i) is equivalent to $H'A^T = 0$.

To, complete the proof, it will be verified that condition (*) $\Leftrightarrow$ there exists v and A such that conditions (i) and (ii) hold.

$\Rightarrow$: Suppose that condition (*) holds. Let the m rows of A be a basis of the code D. Then by the definition of D, it follows that $H'A^T = 0$, so that condition (i) holds. For condition (ii), suppose that there exists a row vector $t \in \mathbb{F}_{q^m}^m$ such that $t(A(g_0 \text{diag}(v))^T) = 0$. Then $A^T t^T$ is in $D \cap \ker(g_0 \text{diag}(v))$, and hence must be the zero vector. Since the rows of A are independent, this implies that t is the zero vector, as required.

⇐: Suppose that there exist v and A such that conditions (i) and (ii) hold. Because of condition (ii), the rows of A must be $\mathbb{F}_q$-linearly independent. Let D be the $\mathbb{F}_q$-span of the rows of A. Then dim(D)=m. In addition, since by condition (i) H'A$^T$=0, it holds that D⊆C'. Finally, a vector in D is of the form tA for some row vector t∈$\mathbb{F}_{q^m}$. If $(tA)^T \notin \ker(g_0 \mathrm{diag}(v))$, then $$(g_0 \mathrm{diag}(v) A^T) t^T = 0.$$

Because the elements of the vector $g_0 \mathrm{diag}(v) A^T$ $\mathbb{F}_q$-linearly independent by condition (ii), it can be seen that t is the zero vector, as required.

Theorem 3.2 The code C of of Lemma 3.1 has a simple $\mathbb{F}_q$-linear repair scheme for the first coordinate if and only if the following condition holds:

Condition (**): There exists a vector $v := (v_1, \ldots, v_{n-1}) \in \mathbb{F}_{q^m}^{n-1}$ such that the following condition holds:

Writing $C' \subseteq \mathbb{F}_q^{n-1}$ for the code with parity-check matrix H':=G'diag(v) and $C'' \subseteq \mathbb{F}_q^{n-1}$ for the code with parity-check matrix $$H'' := \begin{pmatrix} g_0 \\ G' \end{pmatrix} \mathrm{diag}(v),$$

it follows that dim(C'')≤dim(C')−m, which is equivalent to dim(C'')=dim(C')−m. Note that adding one line to a check matrix over $\mathbb{F}_{q^m}$ for a code over $\mathbb{F}_q$ can decrease the dimension by at most m.

Proof. It will be shown that Condition (**) of the theorem-
⇔Condition (*) of Lemma 3.1.
⇒: Suppose that (**) holds. Then it is possible to choose $c_1, \ldots, c_m \in \mathbb{F}_q^{n-1}$ that complete a basis of C'' to a set of dim(C'')+m linearly independent elements in C'. Let D be the $\mathbb{F}_q$-span of $c_1, \ldots, c_m$). Then by construction D ⇔ C'', and dim(D))=m. Also, $$D \cap \ker(g_0 \mathrm{diag}(v)) = (D \cap C') \cap \ker(g_0 \mathrm{diag}(v)) \ (\mathrm{since} \ D \subset C')$$
$$= D \cap (C' \cap \ker(g_0 \mathrm{diag}(v)))$$
$$= D \cap C''$$
$$= \{0\},$$

where the last equality follows front the way the basis of D as constructed.
⇐: Suppose that Condition (*) holds. Then $$C' \supseteq (C' \cap \ker(g_0 \mathrm{diag}(v))) \oplus D.$$

But C'∩ker($g_0$diag(v)) is just C'', so that C'⊇C''⊕D. Since dim(D)=m by assumption, it follows that dim(C'')≤dim(C')−m.

4. Reed-Solomon Codes of Length $q^m$ over $\mathbb{F}_{q^m}$

As a first example for an application of Theorem 3.2, Theorem 1 of Guruswami, incorporated above, will be re-proven. According to embodiments of the disclosure, from this to point on, a Reed-Solomon code of dimension k∈ℕ over $\theta_{q^m}$ is the code obtained by evaluating polynomials of degree≤k−1 from $\mathbb{F}_{q^m}[X]$ on a subset comprising at least k points of $\mathbb{F}_{q^m}$.

Theorem 4.1 (Theorem 1 of Guruswami): Write n:=$q^m$, let k∈ℕ be such that n−k≥n/q, that is, such that k≤$q^m-q^{m-1}$.

Then the Reed-Solomon code of length n and dimension k over $\mathbb{F}_{q^m}$ has a simple $\mathbb{F}_q$-linear repair scheme for any coordinate.

Proof. First, since a linear repair scheme, for at code is automatically also a linear repair scheme for any subcode, it suffices to consider the case k=$q^m-q^{m-1}$. Also, since the code has a (doubly) transitive automorphism group, it suffices to establish a simple linear repair scheme for the first coordinate (see Remark 2.4, above).

Now, suppose that k=$q^m-q^{m-1}$, and let $\alpha \in \mathbb{F}_{q^m}$ be a primitive element. Then the following generator matrix for the Reed-Solomon code of dimension k and length $q^m$ is already in the form of EQ. (1)

$$G := \begin{pmatrix} 1 & 1 & 1 & 1 & \cdots & 1 \\ 0 & 1 & \alpha & \alpha^2 & \cdots & \alpha^{n-2} \\ 0 & 1 & \alpha^2 & (\alpha^2)^2 & \cdots & (\alpha^{n-2})^2 \\ \vdots & \vdots & \vdots & \vdots & \ddots & \vdots \\ 0 & 1 & \alpha^{q^m-q^{m-1}-1} & (\alpha^2)^{q^m-q^{m-1}-1} & \cdots & (\alpha^{n-2})^{q^m-q^{m-1}-1} \end{pmatrix}$$

$$=: \begin{pmatrix} 1 & 1 \\ 0^T & G' \end{pmatrix},$$

where $g_0$=1, the all ones row vector of length $q^m-1$.

For j∈{1, ..., $q^m-1$}, let $v_j := \alpha^{-(j-1)}$. Then H'=G'diag(v) is a check matrix of the cyclic code over $\mathbb{F}_q$ of length $q^m-1$ and zeros the elements of Z':={1, α, ..., $\alpha^{q^m-q^{m-1}-2}$} and their conjugates over $\mathbb{F}_q$, while $$H'' = \begin{pmatrix} g_0 \\ G' \end{pmatrix} \mathrm{diag}(v),$$

is a check matrix of the cyclic code over $\mathbb{F}_q$ with zeros the elements of Z'':=Z' ∪ {$\alpha^{-1}$} and their conjugates.

By Theorem 3.2, it is sufficient to, show that Z' does, not contain an element of the orbit of $\alpha^{-1}$ under the action of Gal($\mathbb{F}_{q^m}/\mathbb{F}_q$)⟨σ⟩, and that the orbit of $\alpha^{-1}$ has m elements. In this regard, recall that for a cyclic code C of length n' with generator polynomial g, it follows that dim(C)=n'−deg(g). Translating to the language of cyclotomic cosets, it should he shown that, the cyclotomic cosets modulo $q^m-1$ the numbers in {0, 1, ..., $q^m-q^{m-1}-2$} do not include the cyclotomic coset of (−1)≡$q^m-2$, and that this last cyclotomic coset has m elements.

According to embodiments of the disclosure, it will be convenient to represent numbers in {0, ..., $q^m-2$} as their length-m base-q expansions. So, for i∈{0, ..., $q^m-2$}, write $[i]_q = (i_{m-1}, i_{m-2}, \ldots, i_0)$ for its base-q expansion, so that $i = \sum_{j=0}^{m-1} i_j q^j$.

Now, $$[q^m-2]_q = (q-1, q-1, \ldots, q-1, q-2). \quad (4)$$

Since all m cyclic shifts of this vector are distinct, the cyclotomic coset of $q^m-2$ indeed has m elements.

Also, since $q^m-q^{m-1}1=(q^m-1)-q^{m-1}$, then $$[q^m-q^{m-1}1]_q = (q-2, q-1, \ldots, q-1, q-1). \quad (5)$$

It follows from EQS. (4) and (5) that $q^m-q^{m-1}-1$ is the smallest element in the cyclotomic coset of $q^m-2$. Hence this cyclotomic coset does not contain any number in {0, 1, ..., $q^m-q^{m-1}-2$}.

5. Reed-Solomon Codes on $\mathbb{F}_2$-Subspaces of $\mathbb{F}_{2^{2r}}$

According to embodiments, this section presents simple repair schemes for Reed-Solomon codes defined on an $\mathbb{F}_2$-subspace of $\mathbb{F}_{q^2}$, where $q=2^r$. A result according to an embodiment is Theorem 5.11, which states that for all even dimension d and for all $r \geq d-1+\log_2(d)$, there exists an $\mathbb{F}_2$-subspace $U \subseteq \mathbb{F}_{2^{2r}}$ with $\dim \mathbb{F}_2(U)=d$, such that the $[2^d, 2^d-2^{d/2}]_{\mathbb{F}_{2^{2r}}}$ Reed-Solomon code defined on U has a simple repair scheme. Moreover, the probability that a randomly selected subspace results in a simple repair scheme is $1-O(1/2^r)$.

In general, to check if Condition (**) holds, there is a need for an exact formula for the dimension of subfield subcodes, as lower bounds are insufficient. For this, some results from H. Stichtenoth, "On the dimension of Subfield Subcodes", IEEE Trans. Inform. Theory, Vol. 36, No. 1, January 1990, the contents of which are herein incorporated by reference in their entirety, will be used, as follows. In what follows, let $\langle \sigma \rangle$ operate on vectors coordinate-wise.

Proposition 5.1 (Lemmas 1, 2 and Corollary 1 of Stichtenoth): For q a prime power and $m \in \mathbb{N}$, let $\sigma: x \mapsto x^q$ be the Frobenius automorphism of $\mathbb{F}_{q^m}/\mathbb{F}_q$. For $n' \in \mathbb{F}$, let $D \subseteq \mathbb{F}_{q^m}^{n'}$ be a linear code. Write $D^0 := \cap_{i=0}^{m-1} \sigma^i(D)$ and $D^\Lambda := \Sigma_{i=0}^{m-1} \sigma^i(D)$. Then
1. $\dim(D|_{\mathbb{F}_q}) = \dim(D^0)$
2. $(D^0)^\perp = (D^\perp)^\Lambda$
3. $\dim(D|_{\mathbb{F}_q}) = N' - \dim(D^\perp)^\Lambda$ It will be convenient to state explicitly a special case of Proposition 5.1.

Corollary 5.2 With the notation of Proposition 5.1, suppose that m=2. Then $$\dim(D|_{\mathbb{F}_q}) = n' - \dim(D^\perp + \sigma(D^\perp)) \quad (6)$$

$$= n' - (2\dim(D^\perp) - \dim(D^\perp \cap \sigma(D^\perp))). \quad (7)$$

Before considering Reed-Solomon codes defined on $\mathbb{F}_2$-vector subspaces of $\mathbb{F}_{q^2}$, need some additional background is needed.

Definition 5.3 Let $K \subset L$ be finite fields. A K-linearized polynomial over L is a polynomial of the form $\Sigma_{i=0}^{l} a_i X^{|K|^i} \in L[X]$. Note that such a polynomial defines a K-linear map $L \to L$.

Theorem 5.4 (Theorem 3.52 of R. Lidl and H. Niederreiter, *Finite Fields*, Vol. 20 of *Encyclopedia of Math. and its Applications*, 2nd Ed., CUP, 1997, p. 110) Let $K \subset L$ be finite fields. Let $U \subset L$ be a K-linear subspace. Then $\Pi_{x \in U}(X-x)$ is a K-linearized polynomial over L.

From this point on, q is always a power of 2. Turn now to Reed-Solomon codes defined on $\mathbb{F}_2$-vector subspaces of $\mathbb{F}_{q^2}$. Note that these codes have a transitive automorphism group: For a subspace U and for $y \in U$, the map $\tau_y: x \mapsto x+y$ permutes U, and is therefore an automorphism of the Reed-Solomon code defined on U, for the reason that the variable change $X \mapsto X+y$ does not increase the degree of a polynomial.

Let U be an $\mathbb{F}_2$-subspace of $\mathbb{F}_{q^2}$, and set $d:=\dim(U)$. Let $n:=|U|=2^d$, and let $n':=n-1$ For $l \in \mathbb{N}$, $1 \leq n'-1$, let $C=C(U, l)$ be the Reed-Solomon code obtained by evaluating polynomials of degree $\leq l$ from $\mathbb{F}_{q^2}[X]$ on the points of U. Since C has a transitive automorphism group, it is sufficient to consider repairing schemes for the coordinate corresponding to $0 \in U$.

From this point on, according to embodiments, it will be assumed that the vector v of Theorem 3.2 is defined by $v_u := 1/u$ for all $u \in U \setminus \{0\}$, assuming that coordinates are labeled by elements of U. With this choice of v, the rows of the matrix H' of Theorem 3.2 can be considered as a basis for the space of polynomial functions $U \setminus \{0\} \to \mathbb{F}_{q^2}$ coming from polynomials of $\mathbb{F}_{q^2}[X]$ of degree $\leq l-1$.

Let $f_U(X) := \Pi_{x \in U}(X-x)$. Then by Theorem 5.4, there are some $a_0, \ldots, a_{d-1} \in \mathbb{F}_{q^2}$ such that $$f_U(X) = X^{2^d} + a_{d-1} X^{2^{d-1}} + \ldots + a_0 X,$$

and with $a_0 \neq 0$ (since $f$ separable by definition). There is an isomorphism of $\mathbb{F}_{q^2}$-algebras $$\mu: \mathbb{F}_{q^2}[X]/f_U(X) \xrightarrow{\sim} \{\text{polynomial functions } U \setminus \{0\} \to \mathbb{F}_{q^2}\}$$

$$g + (f_U(X)) \mapsto (x \mapsto g(x)).$$

For a polynomial $g(X) \in \mathbb{F}_{q^2}[X]$, write $\bar{g}$ for the image of g in $\mathbb{F}_{q^2}[X]/(f_U(X))$.

Let $D' \subseteq \mathbb{F}_{q^2}^{n-1}$ defined by $D':=\ker(H')$ for the matrix H' of Theorem 3.2, recalling that the vector v is fixed and defined by $v_u := 1/u$ for all $u \in U \setminus \{0\}$). Note that $C' = D'|_{\mathbb{F}_q}$. Then $\bar{1}, \bar{X}, \ldots, \bar{X}^{l-1}$ is a basis for $\mu^{-1}(D'^\perp)$. Hence, $$\dim(D'^\perp \cap \sigma(D'^\perp)) = \dim(\mu^{-1}(D'^\perp \cap \sigma(D'^\perp)))$$
$$= \dim(\mu^{-1}(D'^\perp) \cap \mu^{-1}(\sigma(D'^\perp)))$$
$$= \dim\begin{pmatrix} \text{Span}_{\mathbb{F}_{q^2}}\{\bar{1}, \bar{X}, \ldots, \bar{X}^{l-1}\} \cap \\ \text{Span}_{\mathbb{F}_{q^2}}\{\bar{1}, \bar{X}^q, \ldots, (\bar{X}^q)^{l-1}\} \end{pmatrix}.$$

Similarly, let $D'' \subseteq \mathbb{F}_{q^2}^{n-1}$ be defined by $D'' := \ker(H'')$ for the matrix H'' of Theorem 3.2 and for our fixed v. Then $\bar{1}, \bar{X}, \ldots, \bar{X}^{l-1}, \bar{X}^{-1}$ span $\mu^{-1}(D''^\perp)$, (this is, in fact, a basis for $\mu^{-1}(D''^\perp)$: Since $\bar{X}^{-1} = a_0^{-1} \bar{X}^{2^d-2} + a_0^{-1} a_{d-1} \bar{X}^{2^{d-1}-2} + \ldots + a_0^{-1} a_1$ (see below), the assumption $l-1 < 2^d-2$ implies that $\bar{X}^{-1} \notin \text{Span}_{\mathbb{F}_{q^2}}\{\bar{1}, \bar{X}, \ldots, \bar{X}^{l-1}\}$) and $\bar{1}, \bar{X}^q, \ldots, (\bar{X}^q)^{l-1}, (\bar{X}^{-1})^q$ span $\mu^{-1}(\sigma(D''^\perp))$.

Recalling that $f_U(X)/X = X^{2^d-1} + a_{d-1} X^{2^{d-1}-1} + \ldots + a_0$ (where $a_0 \neq 0$), then $$\bar{X}^{-1} = a_0^{-1} \bar{X}^{2^d-2} + a_0^{-1} a_{d-1} \bar{X}^{2^{d-1}-2} + \ldots + a_0^{-1} a_1,$$

and $$(\bar{X}^{-1})^q = a_0^{-q} (\bar{X}^q)^{2^d-2} + a_0^{-q} a_{d-1}^q (\bar{X}^q)^{2^{d-1}-2} + \ldots + a_0^{-q} a_1^q.$$

This implies the following lemma.

Lemma 5.5 with the above notation, if $1-b \geq 2^{d-1}-2$, then $$\text{Span}^{n_{\mathbb{F}_{q^2}}}\{\bar{1}, \bar{X}, \ldots, \bar{X}^{l-1}, \bar{X}^{-1}\} = \text{Span}^{n_{\mathbb{F}_{q^2}}}\{\bar{1}, \bar{X}, \ldots, \bar{X}^{l-1}, \bar{X}^{2^d-2}\},$$

and $$\text{Span}^{n_{\mathbb{F}_{q^2}}}\{\bar{1}, \bar{X}^q, \ldots, (\bar{X}^q)^{l-1}, (\bar{X}^{-1})^q\} = \text{Span}^{n_{\mathbb{F}_{q^2}}}\{\bar{1}, \bar{X}^q, \ldots, (\bar{X}^q)^{l-1}, (\bar{X}^q)^{2^d-2}\}.$$

Proof. Clear.

Definition 5.6. For $j \in \mathbb{N}$, let $\text{wt}_2(j)$ be the number of 1's in the binary expansion of j: If $j = \Sigma_{i=0}^r a_i 2^i$ with $a_i \in \{0,1\}$ for all i, then $\text{wt}_2(j) := \Sigma_{i=0}^r a_i$.

Lemma 5.7 For all $j_1, j_2 \in \mathbb{N}$, $\text{wt}_2(j_1+j_2) \leq \text{wt}_2(j_1) + \text{wt}_2(j_2)$.

Proof. Suppose first that $j_2 = 2^s$ for some s. Write $j_1 = \Sigma_{i=0}^r a_i 2^i$, where $$r := \max\{\lfloor \log_2(j_1) \rfloor, s\} + 1,$$

so that $r > s$ and $a_r = 0$. If $a_s = 0$, then clearly $\text{wt}_2(j_1+j_2) = \text{wt}_2(j_1) + \text{wt}_2(j_2)$ Otherwise, let $s' > s$ be the smallest such that $a_{s'} = 0$. The single 1 from the binary expansion of $j_2$ propagates as a carry, so that for all $i \in \{s, s+1, \ldots, s'-1\}$, the i-th digit of the binary expansion of $j_1+j_2$ is 0, the s'-th digit of this binary expansion is 1, and all other digits of this expansion are the same as those of the expansion of $j_1$. All in all, the total, number of 1's is $wt_2(j_1)+1-(s'-s)wt_2(j_1)+wt_2(j_2)-(s'-s)<wt_2(j_1)+wt_2(j_2)$, as required.

For the general case, suppose that $wt_2(j_2) \geq 2$, and assume the assertion true for all $j_2$ with smaller weight (note that the case $j_2=0$ is obvious). Then, write $j_2=j'_2+j''_2$ with $wt_2(j'_2)=1$ and $wt_2(j''_2)=wt_2(j_2)-1$. Then $$wt_2(j_1 + j_2) = wt_2((j_1 + j'_2) + j''_2)$$
$$\leq wt_2(j_1 + j'_2) + wt_2(j''_2) \text{ (induction hypothesis)}$$
$$\leq wt_2(j_1) + wt_2(j'_2) + wt_2(j''_2) \text{ (induction basis)}$$
$$= wt_2(j_1) + wt_2(j_2),$$

as required.

Proposition 5.8 Using the terminology of the paragraphs receding EQ. (8), for all $d \geq 2$, for all $j \in \mathbb{N}$ with $wt_2(j) \leq d-1$, and for all $s \in \mathbb{N}$.

$$(\overline{X}^{2^s j}) \in \text{Spa}^{n_{\mathbb{F}_{q^2}}} \{\overline{X}^i | i \in \{1, \ldots, 2^d-2\} \text{ and } wt_2(i) \leq wt_2(j)\}. \quad (9)$$

Remark it is clear that $\overline{1}, \overline{X}, \ldots, \overline{X}^{2^d-2}$ span $\mathbb{F}_{q^2}[X]/(f_U/X)$, and for all $i \in \{0, \ldots, 2^d-2\}$, $wt_2(i) \leq d-1$. Hence the maximum weight of an exponent in a spanning set is $\leq d-1$ even if $wt_2(j) > d-1$. Hover while not really necessary for the rest of this disclosure, the condition $wt_2(j) \leq d-1$ is required for stating that $\overline{1}$ is not in the spanning set on the right-hand side of EQ. (9).

Proof of Proposition 5.8: First note that since $wt_2(2^s j)=wt_2(j)$, there is no loss of generality in assuming $s=0$. According to embodiments, let $s=0$ and proceed b induction on $wt_2(j)$. For the basis, suppose that $wt_2(j)=1$, that is, that $j=2^r$ for some r. Hence, it should be shown that for all r, $$\overline{X}^{2^r} \in \text{Spa}^{n_{\mathbb{F}_{q^2}}} \{\overline{X}^i | i \in \{1, \ldots, 2^d-2\} \text{ and } wt_2(i)=1\},$$

for which induction on r will be used. If $r<d$ the assertion is clear. Suppose, therefore, that $r \geq d$ and that there exist $b_0, \ldots, b_{d-1} \in n_{\mathbb{F}_{q^2}}$ such that $$\overline{X}^{2^{r-1}} = \sum_{u=0}^{d-1} b_u \overline{X}^{2^u}.$$

Squaring this equation:

$$\overline{X}^{2^r} = \sum_{u=0}^{d-2} b_u^2 \overline{X}^{2^{u+1}} + b_{d-1}^2 \overline{X}^{2^d}.$$

But since $f_U(X)=X^{2^d}+a_{d-1}X^{2^{d-1}}+\ldots+a_0X$, then $\overline{X}^{2^d}=a_{d-1}\overline{X}^{2^{d-1}}+\ldots+a_0\overline{X}$, as required. This establishes the basis of the induction on $wt_2(j)$.

For the induction step, suppose that $wt_2(j) \leq 2$ and the assertion is true for all j' with $wt_2(j')<wt_2(i)$. Write $j=2^{j_1}+\ldots+2^{j_w}$ for the binary expansion of j, where $j_1<\ldots<j_w$ and $w=wt_2(j) \geq 2$. Then, by the induction basis, $$\overline{X}^j = \overline{X}^{2^{j_1}} \overline{X}^{2^{j_2}} \ldots \overline{X}^{2^{j_w}} \quad (10)$$

$$= \left(\sum_{i_1=0}^{d-1} \alpha_{i_1}^{(1)} \overline{X}^{2^{i_1}}\right) \left(\sum_{i_2=0}^{d-1} \alpha_{i_2}^{(2)} \overline{X}^{2^{i_2}}\right) \ldots \left(\sum_{i_w=0}^{d-1} \alpha_{i_w}^{(w)} \overline{X}^{2^{i_w}}\right)$$

for some $\alpha_0^{(1)}, \ldots, \alpha_{d-1}^{(1)}, \ldots, \alpha_0^{(w)}, \ldots, \alpha_0^{(w)} \in n_{\mathbb{F}_{q^2}}$. Hence, $\overline{X}^j$ is a linear combination of elements the form $$\overline{X}^{2^{i_1}+\ldots+2^{i_w}}. \quad (11)$$

Two cases can be distinguished as follows,

Case I. If there are some $l_1, l_2$ such that $i_{l_1}=i_{l_2}$, then $$2^{i_{l_1}} + 2^{i_{l_2}} = 2^{i_{l_1}+1},$$

so that $$\overline{X}^{2^{i_1}+\ldots+2^{i_w}} = \overline{X}^{2^{i_{l_1}+1}} \cdot \overline{X}^{\sum_{r \neq l_1, l_2} 2^{i_r}}. \quad (12)$$

By Lemma 5.7, $wt_2(\sum_{r \neq l_1, l_2} 2^{i_r}) \leq w-2=wt_2(j)-2$, so that it follows from the induction hypothesis and EQ. (12) that $$\overline{X}^{2^{i_1}+\ldots+2^{i_w}} = \left(\sum_{i=0}^{d-1} \beta_i \overline{X}^{2^i}\right) \cdot \left(\sum_{\substack{k \in \{1, \ldots, 2^d-2\} \\ wt_2(k) \leq wt_2(j)-2}} \gamma_k \overline{X}^k\right)$$

for some coefficients $\{\beta_i\}, \{\gamma_k\}$. This last expression is itself an $\mathbb{F}_{q^2}$-linear combination of elements of the form $\overline{X}^{2^i+k}$ with $wt_2(2^i+k) \leq 1+wt_2(k) \leq wt_2(j)-1$, by lemma 5.7. Using the induction hypothesis again, the desired result is obtained.

Case 2. All the $i_l$ are distinct. Since by assumption $w=wt_2(j) \leq d-1$ and $wt_2(2^d-1)=d$, $2^{i_1}+\ldots+2^{i_w} \leq 2^d-2$. Also, in this case $wt_2(2^{i_1}+\ldots+2^{i_w})=w$, so that EQ. (11) is already in the desired form.

Proposition 5.9 Maintaining the above notation, for all $g \in \mathbb{F}_{q^2}[X]$, $\overline{g}^q=0$ iff $\overline{g}=0$). Also, if $\overline{g}_1, \ldots, \overline{g}_r \in \mathbb{F}_{q^2}[/x]/(f_u X)$ are $\mathbb{F}_{q^2}$ linearly independent, then so are $g_1^q, \ldots, \overline{g}_r^q$.

Proof: For the first assertion, note that $$\overline{g}^q = 0 \Leftrightarrow \frac{f_U}{X} \bigg| g^q \Leftrightarrow \frac{f_U}{X} \bigg| g,$$

where the rightmost implication holds because $f_U$, and hence also $$\frac{f_U}{X},$$

is separable. Hence $\overline{g}^q=0 \Leftrightarrow \overline{g}=0$, as required.

For the second assertion, suppose that $\sum_{i=1}^r \alpha_i \overline{g}_i^q=0$ for some $\alpha_1, \ldots, \alpha_r \in \mathbb{F}_{q^2}$. Then $$(\sum_{i=1}^r \sigma^{-1}(\alpha_i)\overline{g}_i)^q=0,$$

so that $\sum_{i=1}^r \sigma^{-1}(\alpha_i)\overline{g}_i=0$ by the first part. Since the $\overline{g}_i$ are linearly independent, then $\sigma^{-1}(\alpha_i)=0$ for all i, and hence also $\alpha_i=0$ for all i.

Proposition 5.10 Using the terminology of the paragraphs preceding EQ. (8). Suppose that the dimension of the $[2^d, \ell + l]_{\mathbb{F}_{q^2}}$-subspace U of $\mathbb{F}_{q^2}$ is d, so that the Reed-Solomon code C defined on U is a $\mathbb{F}$ code. Suppose that the vector v of Theorem 3.2 is given by $v_u=1/u$ for all $u \in U \setminus \{0\}$. Suppose also that $$\ell \leq \ell_0 := \begin{cases} 2^d - 2^{d/2} - 1 & \text{if } d \text{ is even} \\ d^2 - d^{(d+1)/2} - 1 & \text{if } d \text{ is odd}. \end{cases}$$

Then for C' of Theorem 3.2, $\dim(C') \geq 2$.

Remarks:
1. Informally, this proposition states that "half" of Condition () is satisfied for any subspace of dimension d if $l \leq l_0$. Note that $l_0$ depends on d, but not on q. For example, for even d and for all q with $q^2 \geq 2^d$, the proposition shows that half of Condition () is satisfied for codes of length $n=2$ and dimension up to $n-\sqrt{n}$ in $\mathbb{F}_{q^2}^n$. In the sequel, it will be shown that for r large enough, "all" of condition (**) is satisfied for some $[2^d, 2^d-2^{d/2}]_{\mathbb{F}_{2^{2r}}}$ Reed-Solomon codes.

2. Note that for odd d, the codimension is the same as that for d+1. Hence, the parameters of an odd d can be achieved by shortening a code designed for the even dimension d+1. Therefore, apart from the current proposition, only even d will be considered.

3. Note that for a choice according to an embodiment of v, there do exist some subspaces $U \subseteq \mathbb{F}_{q^2}$ with $\dim(U)=d$ for which Condition () does not hold. For example, if $d=q$, then Condition () does not hold for $U = \mathbb{F}_q \subset \mathbb{F}_{q^2}$, since a single additional row with entries front $\mathbb{F}_q$ in the check matrix cannot decrease the $\mathbb{F}_q$-dimension by more than 1. Similarly, the condition does not hold for subspaces of the form $z \cdot \mathbb{F}_q$ for $z \in \mathbb{F}_{q^2}^*$.

Proof of Proposition 5.10: Recall that $D' \subseteq \mathbb{F}_{q^2}$ is the code with parity-check matrix H', so that $C'=D'|_{\mathbb{F}_q}$. By EQ. (7) of Corollary 5.2, $$\dim(C') = 2^d - 1 - 2\dim(D'^\perp) + \dim(D'^\perp \cap \sigma(D'^\perp)) \quad (13)$$

$$= \dim(D'^\perp \cap \sigma(D'^\perp)) + 2^d - 1 - 2\ell,$$

where $\dim(D'^\perp)=l$ has been used, and recalling that that $\overline{1}, \overline{X}, \ldots, \overline{X}^{l-1}$ is a basis for $\mu^{-1}(D'^\perp)$. Hence, to prove the assertion, it is sufficient to prove that $$\dim(D'^\perp \cap \sigma(D'^\perp)) \geq 2l + 3 - 2^d.$$

In view of EQ. (8), it should be shown that $$\dim(\text{Span}^n_{\mathbb{F}_{q^2}}\{\overline{1}, \overline{X}, \ldots, \overline{X}^{l-1}\} \cap$$
$$\text{Span}^n_{\mathbb{F}_{q^2}}\{\overline{1}, \overline{X}^q, \ldots, (\overline{X}^q)^{l-1}\}) \geq 2l+3-2^d. \quad (14)$$

In other words, it should be shown that $$\text{Span}^n_{\mathbb{F}_{q^2}}\{\overline{1}, \overline{X}^q, \ldots, (\overline{X}^q)^{l-1}\} \quad (15)$$

contains $2l+3-2^d$ independent elements that can be written as linear combinations of $\overline{1}, \overline{X}, \ldots, \overline{X}^{l-1}$. Note first that $\overline{1}, \overline{X}^q, \ldots, (\overline{X}^q)^{l-1}$ are $\mathbb{F}_{q^2}$-linearly independent, because $\overline{1}, \overline{X}, \ldots, \overline{X}^{l-1}$ are linearly dependent and, by Proposition 5.9, the map $\overline{g} \mapsto \overline{g}^q$ preservers this property.

Write $$A := |\{i \in \{0, \ldots, l-1\} | wt_2(i) > wt_2(l-1)\}|$$

and $$B := |\{i \in \{l, \ldots, 2^d-2\} | wt_2(i) \leq wt_3(l-1)\}|.$$

It follows from Proposition 5.8 that for each of the $l-A$ values of i in $\{0, \ldots, l-1\}$ with $wt_2(i) \leq wt_2(l-1)$, $(\overline{X}^q)^i$ a linear combination of classes $\overline{X}^j$ with $wt_2(j) \leq wt_2(l-1)$. Each such linear combination involves at most B classes $\overline{X}^j$ with $j \geq l$. Hence, up to B of the $l-A$ elements $(\overline{X}^q)^i$ can be used to cancel all classes $\overline{X}^j$ with $j \geq l$ in the remaining $l-A-B$ elements. This can be done by choosing elements $(\overline{X}^q)^i$ whose projections to the coordinates $\overline{X}^j$ with $j \geq l$ and $wt_2(j) \leq wt_2(l-1)$ form a basis to the projection of all $l-A$ elements $(\overline{X}^q)^i$ to the same coordinates. Since the projection is to B coordinates, the number of elements in this basis is at most B. This results in at least $l-A-B$ linearly independent elements in the intersection appearing in (14). Hence, if $l-A-B \geq 2l+3-2^d$, then EQ. (14) is satisfied and $\dim(C') \geq 2$. In Appendix A it is shown that for $l=l_0$, it indeed holds that $2^d 3 - l \geq A+B$. So, for $l=l_0$, then $\dim(C') \geq 2$, and consequently the same holds for all $l \leq l_0$.

Theorem 5.11 Let $d \geq 4$ be even. Suppose that $q=2^r$ and that d elements $x_0, \ldots, x_{d-1}$ are drawn uniformly and independently from $\mathbb{F}_{q^2}^*$. Let $U := \text{Span}\mathbb{F}_q\{x_0, \ldots, x_{d-1}\}$. Suppose that $l=l_0=2^d-2^{d/2}-1$, so that if $\dim(U)=d$, then the Reed-Solomon code C defined on U is a $[2^d, 2^d-2^{d/2}]_{\mathbb{F}_{q^2}}$ code. Suppose that the vector v, is given by $v_u=1/u$ for all $u \in U \setminus \{0\}$. Then the probability that both $\dim(U)=d$ and Condition (**) holds is at least $$1 - \frac{\left(1 + \frac{d}{2}(q-1)\right)(2^d - 1) - d}{q^2 - 1},$$

and is positive for $r \geq d-1+\log_2(d)$.

Remark 5.12
1. The case of $r=d/2$ is a special case of Theorem 4.1, above.
2. Some examples (see below) seem to suggest that the result should hold for all $r \geq d/2$, and that the probability of drawing a "good" subspace U is much higher than in the theorem.
3. For $d=4$, the theorem proves the existence of a good subspace for all $r \geq 5$, and Theorem 4.1 covers the case $r=2$. Since the two remaining cases of $r=3, 4$ are considered in the examples below, it can be seen that for $d=4$, a good subspace exists for all $r \geq d/2$.

Before proving the theorem, some auxiliary results are needed.

Proposition 5.13 Using the terminology of Proposition 5.10 and continue to assume that the vector v is given by $v_u=1/u$ for all $u \in U \setminus \{0\}$. Suppose that $l-1 \geq 2^{d-1}-2$, which holds for $l=l_0$ if $d \geq 2$. Then Condition (**) for the $[2^d, 1+{}^1]_{\mathbb{F}_{q^2}}$ Reed-Solomon code defined on U is equivalent to the following condition: For all $\beta_1, \beta_2 \in \mathbb{F}_{q^2}$, $$\beta_1 \overline{X}^{2^d-2} + \beta_2 (\overline{X}^q)^{2^d-2} \in \text{Span}^n_{\mathbb{F}_{q^2}}\{\overline{1}, \overline{X}, \ldots, \overline{X}^{l-1},$$
$$\overline{X}^q, (\overline{X}^q)^2, \ldots, (\overline{X}^q)^{l-1}\} \Rightarrow \beta_1 \beta_2 = 0.$$

or, equivalently, to $$\overline{X}^{2^d-2} \notin \text{Span}^n_{\mathbb{F}_{q^2}}\{\overline{1}, \overline{X}, \ldots, \overline{X}^{l-1}, \overline{X}^q, (\overline{X}^q)^2, \ldots, (\overline{X}^q)^{l-1}\} \quad (16)$$

and $$(\overline{X}^q)^{2^d-2} \notin \text{Span}^n_{\mathbb{F}_{q^2}}\{\overline{1}, \overline{X}, \ldots, \overline{X}^{l-1}, \overline{X}^q, (\overline{X}^q)^2, \ldots, (\overline{X}^q)^{l-1}, \overline{X}^{2^d-2}\}. \quad (17)$$

Proof. By EQ. (6) of Corrolary 5.2, $$\dim(C') - \dim(C'') = \dim(D'|_{\mathbb{F}_q}) - \dim(D''|_{\mathbb{F}_q})$$

$$= \dim(D''^\perp + \sigma(D''^\perp)) - \dim(D'^\perp + \sigma(D'^\perp))$$

Since $D''^\perp D'^\perp + \text{Span}^n_{\mathbb{F}_{q^2}}\{v\}$, then $$D''^\perp + \sigma(D''^\perp) = D'^\perp + \sigma(D'^\perp) + \text{Span}^n_{\mathbb{F}_{q^2}}\{v, \sigma(v)\}.$$

Hence Condition (**) holds iff for $\beta_1, \beta_2 \in \mathbb{F}_{q^2}$, $$\beta_1 v + \beta_2 \sigma(v) \in D'^\perp + \sigma(D'^\perp) \Rightarrow \beta_1 = \beta_2 = 0.$$

Applying the isomorphism $\mu^{-1}$, it can be seen that Condition (**) holds iff for $\beta_1, \beta_2 \in \mathbb{F}_{q^2}$, $$\beta_1 \overline{X}^{-1} + \beta_2 (\overline{X}^{-1})^q \in \mathrm{Span}_{\mathbb{F}_{q^2}}^{n_q} \{\overline{1,X}, \ldots, \overline{X}^{l-1}, \overline{X}^q, \overline{(X^q)}^2, \ldots, \overline{(X^q)}^{l-1}\} \Rightarrow \beta_1 = \beta_2 = 0.$$

which, from Lemma 5.5, is equivalent to $$\beta_1 \overline{X}^{2^d-2} + \beta_2 (\overline{X}^q)^{2^d-2} \in \mathrm{Span}_{\mathbb{F}_{q^2}}^{n_q} \{\overline{1,X}, \ldots, \overline{X}^{l-1}, \overline{X}^q, \overline{(X^q)}^2, \ldots, \overline{(X^q)}^{l-1}\} \Rightarrow \beta_1 = \beta_2 = 0.$$

This concludes the proof

Definition 5.14 (The numbers $i_j$) Recall that that d is assumed even, and note that the numbers $i \in \{0, \ldots, 2^d-2\}$ with $\mathrm{wt}_2(i) = d-1$ are those numbers i of the form $2^d-1-2^j$ with $j \in \{0, \ldots, d-1\}$. Hence, there are d such numbers, and $d/2-1$ of them are $< l_0 = 2^d - 2^{d/2} - 1$, namely, those with $j \in \{d/2+1, \ldots, d-1\}$. For j in the above range, write $i_j := 2^d - 1 - 2^{d-1-j}$, so that $$2^{d-1} - 1 = i_0 < i_1 < \ldots < i_{d-1} 2^d - 2$$

are all the numbers $i \in \{0, \ldots, 2^d-2\}$ with $\mathrm{wt}_2(i) = d-1$, and $i_0, \ldots, i_{d/2-2}$ are all the numbers $i \in \{0, \ldots, l_0-1\}$ with $\mathrm{wt}_2(i) = d-1$.

Definition 5.15: (The matrices $M_r$, $\tilde{M}_r$) for $r \geq 0$ and for i, $j \in \{0, \ldots, 2^d-2\}$, define coefficients $\alpha_{i,j}^{(r)} \in \mathbb{F}_{q^2}$ by setting $(\overline{X}^{2^r})^i = \sum_{j=0}^{2^d-2} \alpha_{i,j}^{(r)} \overline{X}^j$. Define a matrix $M_r \in \mathbb{F}_{q^2}^{d \times d/2}$ as follows:

(18)

$$M_r := \begin{pmatrix} \alpha_{2^d-2,2^d-2}^{(r)} & \alpha_{i_0,2^d-2}^{(r)} & \alpha_{i_1,2^d-2}^{(r)} & \ldots & \alpha_{i_{\frac{d}{2}-2},2^d-2}^{(r)} \\ \alpha_{2^d-2,i_0}^{(r)} & \alpha_{i_0,i_0}^{(r)} & \alpha_{i_1,i_0}^{(r)} & \ldots & \alpha_{i_{\frac{d}{2}-2},i_0}^{(r)} \\ \alpha_{2^d-2,i_1}^{(r)} & \alpha_{i_0,i_1}^{(r)} & \alpha_{i_1,i_1}^{(r)} & \ldots & \alpha_{i_{\frac{d}{2}-2},i_1}^{(r)} \\ \vdots & \vdots & \vdots & \ddots & \vdots \\ \alpha_{2^d-2,i_{\frac{d}{2}-2}}^{(r)} & \alpha_{i_0,i_{\frac{d}{2}-2}}^{(r)} & \alpha_{i_1,i_{\frac{d}{2}-2}}^{(r)} & \ldots & \alpha_{i_{\frac{d}{2}-2},i_{\frac{d}{2}-2}}^{(r)} \\ \hline \alpha_{2^d-2,i_{\frac{d}{2}-1}}^{(r)} & \alpha_{i_0,i_{\frac{d}{2}-1}}^{(r)} & \alpha_{i_1,i_{\frac{d}{2}-1}}^{(r)} & \ldots & \alpha_{i_{\frac{d}{2}-2},i_{\frac{d}{2}-1}}^{(r)} \\ \alpha_{2^d-2,i_{\frac{d}{2}}}^{(r)} & \alpha_{i_0,i_{\frac{d}{2}}}^{(r)} & \alpha_{i_1,i_{\frac{d}{2}}}^{(r)} & \ldots & \alpha_{i_{\frac{d}{2}-2},i_{\frac{d}{2}}}^{(r)} \\ \vdots & \vdots & \vdots & \ddots & \vdots \\ \alpha_{2^d-2,i_{d-2}}^{(r)} & \alpha_{0,i_{d-2}}^{(r)} & \alpha_{i_1,i_{d-2}}^{(r)} & \ldots & \alpha_{i_{\frac{d}{2}-2},i_{d-2}}^{(r)} \end{pmatrix}$$

Note that each column of $M_r$ includes some of the coefficients corresponding to $(\overline{X}^{2^r})^i$ for some i with $i = 2^d-2$ or $i < l_0$ and $\mathrm{wt}_2(i) = d-1$, and the coefficients appearing in each column correspond to all basis elements $\overline{X}^j$ with $\mathrm{wt}_2(j) = d-1$.

Define also a matrix $\tilde{M}_r \in \mathbb{F}_{q^2}^{d/2 \times d/2}$ by letting $\tilde{M}_r$ include the last $d/2$ rows of $M_r$, the part below the horizontal line in EQ. (18)).

Proposition 5.16: Using the terminology of Proposition 5.13, if $\det(\tilde{M}_r) \neq 0$ for $r = \log_2(q)$, then Condition (**) holds for $l = l_0$, and hence for all $l \leq l_0$.

Proof. Observe that the conditions of EQS. (16) and (17 can be written as follows:

(i) $\overline{X}^{2^d-2}$ is not in the $\mathbb{F}_{q^2}$-span of the projections of $\overline{X}^q$, $(\overline{X}^q)^2, \ldots, (\overline{X}^q)^{l_0-1}$ to coordinates $\overline{X}^{l_0}, \overline{X}^{l_0+1}, \ldots, \overline{X}^{2^d-2}$, and (ii) the projection of $(\overline{X}^q)^{2^d-2}$ to coordinates $\overline{X}^{l_0}$, $\overline{X}^{l_0+1}, \ldots, \overline{X}^{2^d-3}$ is not in the $\mathbb{F}_{q^2}$-span of the projections of $\overline{X}^q, (\overline{X}^q)^2, \ldots, (\overline{X}^q)^{l_0-1}$ to the same coordinates.

Consider (i) above. By Proposition 5.8, if $\overline{X}^{2^d-2}$ appears in a sum of the form $\Sigma_{i=1}^{l_0-1} \beta_i (\overline{X}^q)^i$, then at least one $\beta_i$ with $\mathrm{wt}_2(i) = d-1$ must be non-zero. In addition, by the same proposition, only elements of the form $(\overline{X}^q)^i$ with $\mathrm{wt}_2(i) = d-1$ may contribute to the projection to coordinates $\overline{X}^j$ for $j \in \{l_0, \ldots, 2^d-3\}$ with $\mathrm{wt}_2(j) = d-1$. Hence, if the projections of $(\overline{X}^q)^i$ for $i \in \{1, \ldots, l_0-1\}$ with $\mathrm{wt}_2(i) = d-1$ to the above coordinates are $\mathbb{F}_{q^2}$-linearly independent then (i) must hold in other words, linear independence of the last $d/2-1$ columns of $\tilde{M}_r$ is sufficient for (i).

Similarly, by Proposition 5.8 if the projection of $(\overline{X}^q)^{2^d-2}$ to the coordinates $\overline{X}^j$ for $j \in \{l_0, \ldots, 2^d-3\}$ with $\mathrm{wt}_2(j) = d-1$ is not in the span of the projections of $(\overline{X}^q)^i$ for $i \in \{1, \ldots, l_0-1\}$ with $\mathrm{wt}_2(i) = d-1$ to the same coordinates, then (ii) must hold, since by Proposition 5.8, since only coordinates j with $\mathrm{wt}_2(j) = d-1$ are being considered, only i's with $\mathrm{wt}_2(i) = d-1$ need be taken into account. For the other i's, $(\overline{X}^q)^i$ has zero projection to the above coordinates, by the proposition. This shows that if $\det(\tilde{M}_r) \neq 0$, then both (i) and (ii) hold, as required.

To continue, parametrize the problem. Instead of working in $\mathbb{F}_{q^2}[X]$, work in $\mathbb{F}_2[X, T_0, \ldots, T_{d-1}]$ for free variables $T_0, \ldots, T_{d-1}$. For this, let $T := (T_0, \ldots, T_{d-1})$ be a vector of free variables over $\mathbb{F}_2[X]$, and let $f(X, T) \in \mathbb{F}_2[X, T]$ be defined by $$f(X,T) := X^{2^d} + T_{d-1} X^{2^{d-1}} + T_{d-2} X^{2^{d-2}} + \ldots + T_1 X^2 + T_0 X.$$

Re-define $(g \mapsto \bar{g})$ to be the canonical homomorphism $\mathbb{F}_2[X, T] \to \mathbb{F}_2[X, T]/(f/X)$. Since $\mathbb{F}_2[T] \subseteq \mathbb{F}_2[X, T] \to \mathbb{F}_2[X, T]/(f/X)$ is an injection, which follows from $\deg_X(uv) = \deg_X(u) + \deg_X(v)$, $\mathbb{F}_2[T]$ can be thought of as a subring of $\mathbb{F}_2[X, T]/(f/X)$. In addition, $\mathbb{F}_2[X, T]/(f/X)$ is a free $\mathbb{F}_2[T]$-module with basis $\overline{1}, \overline{X}, \ldots, \overline{X}^{2^d-2}$. Note that $\overline{1}, \overline{X}, \ldots, \overline{X}^{2^d-2}$ do generate $\mathbb{F}_2[X, T]/(f/X)$ as an $\mathbb{F}_2[T]$-module, since the coefficient of $X^{2^d-1}$ in $f/X$ is a unit.

The idea is that for any finite dimensional $\mathbb{F}_2$-subspace U of any extension field K of $\mathbb{F}_2$ (e.g., $K = \mathbb{F}_{q^2}$) the coefficients of $f_U$ can be substituted for the $T_i$.

Definition 5.17: (The matrices $\mathcal{M}_r$ and $\tilde{\mathcal{M}}_r$). For integer r, define matrices $\mathcal{M}_r \in \mathbb{F}_2[T]^{d \times d/2}$ and $\tilde{\mathcal{M}}_r \in \mathbb{F}_2[T]^{d/2 \times d/2}$ as follows. The matrix $\mathcal{M}_r$ is defined as the right-hand side of EQ. (18), where now $\alpha_{i,j}^{(r)} \in \mathbb{F}_2[T]$ are the unique polynomials in $(\overline{X}^{2^r})^i = \sum_{j=0}^{2^d-2} \alpha_{i,j}^{(r)}(T) \overline{X}^j$. The matrix $\tilde{\mathcal{M}}_r$ is defined as the last $d/2$ rows of $\mathcal{M}_r$. Note that by Lemma B.1, if for an $\mathbb{F}_2$-subspace $U \in \mathbb{F}_{q^2}, a_0, \ldots, a_{d-1} \in \mathbb{F}_{q^2}$ are such that $f_U(X) = X^{2^d} + a_{d-1} X^{2^{d-1}} + \ldots + a_0 X$, then $M_r = \mathcal{M}_r(a_0, \ldots, a_{d-1})$ and $\tilde{M}_r = \tilde{\mathcal{M}}_r(a_0, \ldots, a_{d-1})$. Consequently, $\det(\tilde{M}_r) = (\det(\tilde{\mathcal{M}}_r))(a_0, \ldots, a_{d-1})$.

Next, it will be shown that for $r \geq d/2$, $\det(\tilde{\mathcal{M}}_r)$ is not the zero polynomial in $\mathbb{F}_2[T]$. To this end, begin with the following lemma.

Lemma 5.18: (Update Lemma) Write $$A(T) := \begin{pmatrix} T_1 & 1 & T_{d-1} & T_{d-2} & \ldots & T_3 & T_2 \\ 0 & 0 & T_0 & 0 & \ldots & 0 & 0 \\ 0 & 0 & 0 & T_0 & \ldots & 0 & 0 \\ \vdots & \vdots & \vdots & \vdots & \ddots & \vdots & \vdots \\ 0 & 0 & 0 & 0 & \ldots & T_0 & 0 \\ 0 & 0 & 0 & 0 & \ldots & 0 & T_0 \\ T_0 & 0 & 0 & 0 & \ldots & 0 & 0 \end{pmatrix} \in \mathbb{F}_2[y]^{d \times d}$$

For all i and r, and for the $i_j$'s of Definition 5.14, the $\alpha_{i,j}^{(r)} = \alpha_{i,j}^{(r)}(T)$ of Definition 5.17 satisfy $$\begin{pmatrix} \alpha_{i,2^d-2}^{(r+1)} \\ \alpha_{i,i_0}^{(r+1)} \\ \alpha_{i,i_1}^{(r+1)} \\ \vdots \\ \alpha_{i,i_{d-2}}^{(r+1)} \end{pmatrix} = A \begin{pmatrix} (\alpha_{i,2^d-2}^{(r)})^2 \\ (\alpha_{i,i_0}^{(r)})^2 \\ (\alpha_{i,i_1}^{(r)})^2 \\ \vdots \\ (\alpha_{i,i_{d-2}}^{(r)})^2 \end{pmatrix}. \quad (19)$$

Proof: It holds that $$(\overline{X}^{2^{r+1}})^i = \left((\overline{X}^{2^r})^i\right)^2$$
$$= \left(\sum_{j=0}^{2^d-2} \alpha_{i,j}^{(r)}(T)\overline{X}^j\right)^2$$
$$= \underbrace{\sum_{j=0}^{2^{d-1}-1} \alpha_{i,j}^{(r)}(T)^2 \overline{X}^{2j}}_{=:S_1} + \underbrace{\sum_{j=2^{d-1}}^{2^d-2} \alpha_{i,j}^{(r)}(T)^2 \overline{X}^{2j}}_{=:S_2}.$$

From Proposition 5.8, only j's with $wt_2(j)=d-1$ can contribute to $\alpha_{i,k}^{(r+1)}$ for k With $wt_2(k)=d-1$. In the sum $S_1$, there is only such j, namely $2^{d-1}-1$. In the sum $S_2$, the relevant j's are those of the form $j=2^d-1-2^{j'}$ for $j' \in \{0, 1, \ldots, d-2\}$, from Definition 5.14, Hence, the partial sum $$S_3 := (\alpha_{i,2^{d-1}-1}^{(r)})^2 \overline{X}^{2^d-2} + \Sigma_{j=0}^{d-2}(\alpha_{i,2^d-1-2^{j'}}^{(r)})^2 \overline{X}^{2^{d+1}-2-2^{j+1}}$$

includes all contributions to the $\alpha_{i,k}^{(r+1)}$ for k with $wt_2(k)=d-1$.

Now $$\overline{X}^{2^{d+1}-2-2^{j+1}} = \overline{X}^{2^d} \cdot \overline{X}^{2^d-2-2^{j+1}}$$
$$= \left(\sum_{\ell=0}^{d-1} T_\ell \overline{X}^{2^\ell}\right) \overline{X}^{2^d-2-2^{j+1}}$$
$$= \sum_{\ell=0}^{d-1} T_\ell \overline{X}^{2^\ell + 2^d - 2 - 2^{j+1}}.$$

Substitute is $S_3$ to get $$S_3 := (\alpha_{i,2^{d-1}-1}^{(r)})^2 \overline{X}^{2^d-2} + \Sigma_{j=0}^{d-2}(\alpha_{i,2^d-1-2^{j'}}^{(r)})^2 \Sigma_{\ell=0}^{d-1} T_\ell \overline{X}^{2^\ell + 2^d - 2 - 2^{j+1}}.$$

Once again, only those exponents with $wt_2(\cdot)=d-1$ can contribute to $\alpha_{i,k}^{(r+1)}$ for k with $wt_2(k)=d-1$ and should be kept. For $j+1 \in \{1, \ldots, d-1\}$, the binary representation of $2^d-2-2^{j+1}=(2^d-1)-1-2^{j+1}$ has exactly two zeros (the coefficients of $2^0$ and $2^{j+1}$), and so $wt_2(2^\ell + 2^d - 2 - 2^{j+1})=d-1$ iff $l \in \{0, j+1\}$. It follows that all contributions to the $\alpha_{i,k}^{(r+1)}$ for k with $wt_2(k)=d-1$ appear in $$(\alpha_{i,2^{d-1}-1}^{(r)})^2 \overline{X}^{2^d-2} + \sum_{j=0}^{d-2}(\alpha_{i,2^d-1-2^j}^{(r)})^2 \left(T_0 \overline{X}^{2^d-1-2^{j+1}} + T_{j+1}\overline{X}^{2^d-2}\right) =$$

$$\overline{X}^{2^d-2}\left((\alpha_{i,2^{d-1}-1}^{(r)})^2 + \sum_{j=0}^{d-2}(\alpha_{i,2^d-1-2^j}^{(r)})^2 T_{j+1}\right) +$$

$$\sum_{j=0}^{d-2} T_0 (\alpha_{i,2^d-1-2^j}^{(r)})^2 \overline{X}^{2^d-1-2^{j+1}}.$$

Recalling that $2^d-1-2^j=i_{d-1-j}$ and using a variable change $j \leftrightarrow d-1-j$ in the last sum, the above expression reads $$\overline{X}^{2^d-2}((\alpha_{i,i_0}^{(r)})^2 + \Sigma_{j=0}^{d-2}(\alpha_{i,i_{d-1-j}}^{(r)})^2 T_{j+1}) + \Sigma_{j=1}^{d-1} T_0(\alpha_{i,i_j}^{(r)})^2 \overline{X}^{i_{j-1}}.$$

This concludes the proof.

Definition 5.19: (The Matrices $A_1$ and $_2A$). For the matrix A of Lemma 5.18, let $A_1 \in \mathbb{F}_2[T]^{d \times d/2}$ include the first d/2 columns of A, and let $_2A \in \mathbb{F}_2[T]^{d/2 \times d}$ include the last d/2 rows of A. Explicitly, $$A_1 = \begin{pmatrix} T_1 & 1 & T_{d-1} & T_{d-2} & T_{d-3} & \cdots & T_{d/2+2} \\ 0 & 0 & T_0 & 0 & 0 & \cdots & 0 \\ 0 & 0 & 0 & T_0 & 0 & \cdots & 0 \\ \vdots & \vdots & \vdots & \vdots & \vdots & \ddots & \vdots \\ 0 & 0 & 0 & 0 & 0 & \cdots & T_0 \\ 0 & 0 & 0 & 0 & 0 & \cdots & 0 \\ 0 & 0 & 0 & 0 & 0 & \cdots & 0 \\ 0 & 0 & 0 & 0 & 0 & \cdots & 0 \\ \vdots & \vdots & \vdots & \vdots & \vdots & \ddots & \vdots \\ 0 & 0 & 0 & 0 & 0 & \cdots & 0 \\ T_0 & 0 & 0 & 0 & 0 & \cdots & 0 \end{pmatrix} \in \mathbb{F}_2[T]^{d \times d/2},$$

in particular, using 0, 1, ..., to number rows, rows number d/2−1, ..., d−2 are zero, and $$_2A = T_0 \begin{pmatrix} 0 & 0 & \cdots & 0 & 0 & 1 & 0 & \cdots & 0 \\ 0 & 0 & \cdots & 0 & 0 & 0 & 1 & \cdots & 0 \\ \vdots & \vdots & \ddots & \vdots & \vdots & \vdots & \vdots & \ddots & \vdots \\ 0 & 0 & \cdots & 0 & 0 & 0 & 0 & \cdots & 1 \\ 1 & 0 & \cdots & 0 & 0 & 0 & 0 & \cdots & 0 \end{pmatrix} \in \mathbb{F}_2[y]^{d/2 \times d}$$

Definition 5.10 (The operation $(\cdot)^{\odot k}$). For a matrix $M=\{m_{ij}\}$ with entries in some ring and for an integer k, let $M^{\odot k}$ be the matrix obtained by raising each entry of M to the power of k: $M^{\odot k}:=\{m_{ij}^k\}$.

Remark 5.11 Note that for matrices with entries in a ring of characteristic 2, in particular, in $\mathbb{F}_2[T]$, it holds that for all $j \in \mathbb{N}$, $(M_1 M_2)^{\odot 2^j} = M_1^{\odot 2^j} M_2^{\odot 2^j}$ whenever $M_1 M_2$ is defined. This fact will be used without farther mention below. Note also that in the case of characteristic 2, $\det(M^{\odot 2})=\det(M)^2$ for a square matrix M.

Lemma 5.22 It holds that $$\mathcal{M}_0 = \begin{pmatrix} I_{d/2} \\ 0_{d/2 \times d/2} \end{pmatrix} \quad (20)$$

and for $r \geq 1$, $$\mathcal{M}_r = A \cdot A^{\odot 2} \cdot A^{\odot 4} \cdots A^{\odot 2^{r-2}} \cdot A_1^{\odot 2^{r-1}}, \quad (21)$$

a total of r multiplied matrices. Consequently.

$$\tilde{\mathcal{M}}_r = {}_2A \cdot A^{\odot 2} \cdot A^{\odot 4} \cdots A^{\odot 2^{r-2}} \cdot A_1^{\odot 2^{r-1}}. \quad (22)$$

Remark 5.23 For clarity, EQ. (21) is expressed explicitly for the cases where $r-2 \leq 1$, that is, for $r \leq 3$: $\mathcal{M}_1 = A_1$, $\mathcal{M}_2 = A \cdot A_1^{\odot 2}$, $\mathcal{M}_3 = A \cdot A^{\odot 2} \cdot A_1^{\odot 4}$.

Proof of Lemma 5.23: EQ. (20) follows directly from the definition of $\mathcal{M}_r$, and then EQ. (24) follows from Lemma 5.18 by induction. Finally, EQ. (22) follows from EQ. (21) and the definition of $\widetilde{\mathcal{M}}_r$ as the last d/2 rows of $\mathcal{M}_r$.

It can now be proven that $\det(\widetilde{\mathcal{M}}_r)$ is not the zero polynomial.

Lemma 5.24: For even d≥4 and r≥d/2, $\det(\widetilde{\mathcal{M}}_r) \in \mathbb{F}_2[T]$ is a non-zero polynomial of total $$\text{degree} \leq \frac{d}{2}(2^r - 1)$$

Proof. First, it will be proven by induction on r that $\det(\widetilde{\mathcal{M}}_r)$ is not the zero polynomial. For the basis, consider the case r=d/2. Note that B:=A(1, 0, . . . , 0) represents the cyclic shift left operator. Hence, if d/2≥3, $$N := B^{\odot 2} \ldots B^{\odot 2^{d/2-2}} = B^{d/2-2}$$

represents the cyclic shift left by d/2−2 operator. Therefore, $$N' := N \cdot A_1(1,0,\ldots,0)^{\odot 2^{d/2-1}} = N \cdot A_1(1,0,\ldots,0)$$

is given by $$N' = \begin{pmatrix} 0 & 0 & \ldots & 0 & 1 \\ 0 & 0 & \ldots & 0 & 0 \\ \vdots & \vdots & \ddots & \vdots & \vdots \\ 0 & 0 & \ldots & 0 & 0 \\ 0 & 0 & \ldots & 0 & 0 \\ 1 & 0 & \ldots & 0 & 0 \\ 0 & 1 & \ldots & 0 & 0 \\ \vdots & \vdots & \ddots & \vdots & \vdots \\ 0 & 0 & \ldots & 1 & 0 \end{pmatrix}.$$

It follows that $\widetilde{\mathcal{M}}_{d/2}(1, 0, \ldots, 0) =_2 A(1, 0, \ldots, 0) N' = I_{d/2}$, and $$(\det(\widetilde{\mathcal{M}}_{d/2}))(1,0,\ldots,0) = 1. \quad (23)$$

For d/2=2, where $\widetilde{\mathcal{M}}_{d/2} =_2 A \cdot A_1^{\odot 2}$, it can be verified directly that $\widetilde{\mathcal{M}}_{d/2}(1, 0, \ldots, 0) = I_{d/2}$, so that EQ. (23) holds also for this case. This shows that $\det(\widetilde{\mathcal{M}}_{d/2}) \neq 0 \in \mathbb{F}_2[T]$ and establishes the induction basis.

For the induction step, assume that r≥d/2+1 and the assertion is true for r−1. Write $_2A' :=_2 A/T_0 \in \mathbb{F}_2^{d/2 \times d}$, and note that $_2A' = (_2A')^{\odot 2}$. When by EQ. (22), $$\det(\widetilde{\mathcal{M}}_r) = T_0^{d/2} \det\left((_2A')^{\odot 2} \cdot A^{\odot 2} \ldots A^{\odot 2^{r-2}} \cdot A_1^{\odot 2^{r-1}}\right) \quad (24)$$

$$= T_0^{d/2}\left(\det\left((_2(A') \cdot A \ldots A^{\odot 2^{r-3}} \cdot A_1^{\odot 2^{r-2}}\right)\right)^2.$$

Now, using 0, 1, . . . to index rows:

$$(_2A') \cdot A = \begin{pmatrix} \text{row}_{d/2+1}(A) \\ \text{row}_{d/2+2}(A) \\ \vdots \\ \text{row}_{d-1}(A) \\ \text{row}_0(A) \end{pmatrix}.$$

Cyclically shifting the rows results in the matrix $$\begin{pmatrix} T_1 & 1 & T_{d-1} & \ldots & T_{d/2+2} & T_{d/2+1} & T_{d/2} & T_{d/2-1} & \ldots & T_3 & T_2 \\ 0 & 0 & 0 & \ldots & 0 & 0 & 0 & T_0 & \ldots & 0 & 0 \\ \vdots & \vdots & \vdots & \ddots & \vdots & \vdots & \vdots & \vdots & \ddots & \vdots & \vdots \\ 0 & 0 & 0 & \ldots & 0 & 0 & 0 & 0 & \ldots & T_0 & 0 \\ 0 & 0 & 0 & \ldots & 0 & 0 & 0 & 0 & \ldots & 0 & T_0 \\ T_0 & 0 & 0 & \ldots & 0 & 0 & 0 & 0 & \ldots & 0 & 0 \end{pmatrix} \in \quad (25)$$

$$\mathbb{F}_2[T]^{d/2 \times d}.$$

Write $_3A$ for the matrix in EQ. (25), and let $$\widetilde{\mathcal{N}}_r :=_3 A \cdot A^{\odot 2} \cdot A^{\odot 2^2} \ldots A^{\odot 2^{r-2}} \cdot A_1^{\odot 2^{r-2}}.$$

It follows from EQ. (24) that $\det(\widetilde{\mathcal{M}}_r) \neq 0$ iff $\det(\widetilde{\mathcal{N}}_r) \neq 0$. By the $\widetilde{\mathcal{M}}_2[T]$-linearity of the determinant in the first row, it is shown that $$\det(\widetilde{\mathcal{N}}_r) = T_{d/2} \cdot \det\begin{bmatrix} \begin{pmatrix} 0 & 0 & 0 & \ldots & 0 & 0 & 1 & 0 & \ldots & 0 & 0 \\ 0 & 0 & 0 & \ldots & 0 & 0 & 0 & T_0 & \ldots & 0 & 0 \\ \vdots & \vdots & \vdots & \ddots & \vdots & \vdots & \vdots & \vdots & \ddots & \vdots & \vdots \\ 0 & 0 & 0 & \ldots & 0 & 0 & 0 & 0 & \ldots & T_0 & 0 \\ 0 & 0 & 0 & \ldots & 0 & 0 & 0 & 0 & \ldots & 0 & T_0 \\ T_0 & 0 & 0 & \ldots & 0 & 0 & 0 & 0 & \ldots & 0 & 0 \end{pmatrix} \cdot A^{\odot 2} \\ \ldots A^{\odot 2^{r-3}} \cdot A_1^{\odot 2^{r-2}} \end{bmatrix} +$$

$$\det\begin{bmatrix} \begin{pmatrix} T_1 & 1 & T_{d-1} & \ldots & T_{d/2+2} & T_{d/2+1} & 0 & T_{d/2-1} & \ldots & T_3 & T_2 \\ 0 & 0 & 0 & \ldots & 0 & 0 & 0 & T_0 & \ldots & 0 & 0 \\ \vdots & \vdots & \vdots & \ddots & \vdots & \vdots & \vdots & \vdots & \ddots & \vdots & \vdots \\ 0 & 0 & 0 & \ldots & 0 & 0 & 0 & 0 & \ldots & T_0 & 0 \\ 0 & 0 & 0 & \ldots & 0 & 0 & 0 & 0 & \ldots & 0 & T_0 \\ T_0 & 0 & 0 & \ldots & 0 & 0 & 0 & 0 & \ldots & 0 & 0 \end{pmatrix} \cdot A^{\odot 2} \\ \ldots A^{\odot 2^{r-3}} \cdot A_1^{\odot 2^{r-2}} \end{bmatrix}.$$

Note that the following fact was used: for rows $r_0$, $r'_0$, $r_1$, $r_2$, . . . and for a matrix. M, $$\det\left(\begin{pmatrix} r_0 + r'_0 \\ r_1 \\ r_2 \\ \vdots \end{pmatrix} \cdot M\right) = \det\left(\begin{pmatrix} r_0 M + r'_0 M \\ r_1 M \\ r_2 M \\ \vdots \end{pmatrix}\right) = \det\left(\begin{pmatrix} r_0 \\ r_1 \\ r_2 \\ \vdots \end{pmatrix} \cdot M\right) + \det\left(\begin{pmatrix} r'_0 \\ r_1 \\ r_2 \\ \vdots \end{pmatrix} \cdot M\right).$$

Note also that the first determinant in the above sum equals $\det(\widetilde{\mathcal{M}}_{r-1})/T_0$, and is therefore non-zero by the induction hypothesis. In addition, the first summand ($T_{d/2} \cdot \det(\ldots)$) is the only one in which $T_{d/2}$ may appear in an odd degree, and as the first determinant is non-zero and $T_{d/2}$ appears in all its monomials in an even degree, the first summand must contain monomials whose $T_{d/2}$-degree is odd. As such monomials cannot be canceled by monomials in the second determinant, whose $T_{d/2}$-degree is essentially even, it can be concluded that $\det(\tilde{\mathcal{N}}_r) \neq 0$, so that $\det(\tilde{\mathcal{M}}_r) \neq 0$. This completes the proof that $\det(\tilde{\mathcal{M}}_r) \neq 0$ for all $r \geq d/2$.

As for the assertion regarding the total degree, note first that combining EQ. (22), the fact that all polynomials in A are either 1 or some $T_j$, and the additivity of the total degree, it can be seen that the total degree of each entry in $\tilde{\mathcal{M}}_r$ is at most $1+2+\ldots+2^{r-1}=2^r-1$. As the determinant of a $d/2 \times d/2$ matrix is a sum of products of $d/2$ entries, it follows that $\text{tot. deg}(\tilde{\mathcal{M}}_r) \geq (d/2)(2^r-1)$, as required.

Theorem 5.11 can now be proven.

Proof of Theorem 5.11: Take some $x_0, \ldots, x_{d-1} \in \mathbb{F}_{q^2}$. The condition that the $x_i$ are $\mathbb{F}_2$-linearly independent can be expressed as $g(x_0, \ldots, x_{d-1}) \neq 0$ for $$g(X_0, \ldots, X_{d-1}) := (X_0+X_1)(X_0+X_2) \ldots (X_{d-2}+X_{d-1}) \ldots (X_0+\ldots+X_{d-1}),$$

a product of $2^d - d - 1$ linear polynomials. In addition, assuming that $x_0, \ldots, x_{d-1}$ are $\mathbb{F}_2$-linearly independent and writing U for the subspace that they span, the coefficients $a_0, \ldots, a_{d-1}$ of $f_U = \prod_{x \in U}(X+x) = X^{2^d} + a_{d-1}X^{2^{d-1}} + \ldots + a_0 X$ are obtained by substituting $(x_0, \ldots, x_{d-1})$ in polynomials of total degrees $\leq 2^d - 2^j$ for $j=0, 1, \ldots, d-1$, respectively, in $\mathbb{F}_2[X_0, \ldots, X_{d-1}]$. Substituting these polynomials from $\mathbb{F}_2[X_0, \ldots, X_{d-1}]$ for the $T_i$ in $\det(\tilde{\mathcal{M}}_r)$ with $r=\log_2(q)$, results in a polynomial $h \in \mathbb{F}_2[X_0, \ldots, X_{d-1}]$ of total degree at most $$(2^d - 1) \cdot \text{tot} \cdot \text{deg}(\det(\tilde{\mathcal{M}}_r)) \leq (2^d - 1) \cdot \frac{d}{2}(q-1), \quad (26)$$

where EQ. (26) follows from Lemma 5.24 and the fact that for a field K, a polynomial $u \in K[Y_0, \ldots, Y_{n_1-1}]$ and polynomials $v_0, \ldots, v_{n_1-1} \in K[Z_0, \ldots, Z_{n_1-1}]$, $$\text{tot. deg}(u(v_0, \ldots, v_{n_1-1})) \leq \text{tot. deg}(u) \cdot \max\{\text{tot. deg}(v_i)\}_i.$$

To see the validity of the previous equation, take a monomial $Y_0^{i_0} \ldots Y_{n_1-1}^{i_{n_1-1}}$ appearing in u, then by definition, $\Sigma i_j \leq \text{tot. deg}(u)$. Substituting the $v_j$ for the $Y_j$ and using $\text{tot. deg}(fg) = \text{tot. deg}(f) + \text{tot. deg}(g)$, it is clear that the total degree after substitution is not greater than $i_0 \cdot \text{tot. deg}(v_0) + \ldots + i_{n_1-1} \cdot \text{tot. deg}(v_{n_1-1}) \leq (\Sigma i_j) \max\{\text{tot. deg}(v_i)\}$.

Write $X := (X_0, \ldots, X_{d-1})$. According to an embodiment, it should be shown that $(gh)(X)$ has a non-zero in $\mathbb{F}_{q^2}^d$. This will be accomplished with the Schwartz-Zippel lemma, which states that if $f \in K[Y_0, \ldots, Y_{m-1}]$ is non-zero and has total degree $\delta$ (where K is some field, $m \in \mathbb{N}$, and $\delta \in \mathbb{N}$), and if $S \subseteq K$ is a finite set, then the number of $(y_0, \ldots, y_{m-1}) \in S^m$ for which $f(y_0, \ldots, y_{m-1}) = 0$ is at most $\delta \cdot |S|^{m-1}$. However, it first needs to be shown that $gh \neq 0$. Since $g(X)$ is obviously non-zero, it only needs to be shown that $h(X) \neq 0$. If $h(X)$ is the zero polynomial in $\mathbb{F}_2[X]$, then for any extension field K of $\mathbb{F}_2$ and for any $d$-dimensional $\mathbb{F}_2$-subspace U of K, the result of substituting the $a_i$ coming from $\prod_{x \in U}(X-x) = X^{2^d} + a_{d-1}X^{2^{d-1}} + \ldots + a_0 X$ for the $T_i$ in $\det(\tilde{\mathcal{M}}_r)$ is $0 \in K$. Suppose that $|K|=Q$ where $Q \geq 2^d$ is some power of 2. Noting that distinct subspaces result in distinct vectors $(a_0, \ldots, a_{d-1})$, this means that the non-zero polynomial $\det(\tilde{\mathcal{M}}_r)$ has at least $$N_1 := \frac{(Q-1)(Q-2)(Q-4) \ldots (Q-2^{d-1})}{(2^d-1)(2^d-2)(2^d-4) \ldots (2^d-2^{d-1})}$$

zeroes. However, since $\tilde{\mathcal{M}}_r \neq 0$ and tot. $\deg(\det(\tilde{\mathcal{M}}_r)) \leq d/2)(q-1)$, it follows from the Schwartz-Zippel lemma that the number of zeros of $\det(\tilde{\mathcal{M}}_r)$ in $K^d$ is at most $Q^{d-1}(d/2)(q-1)$, which is in $O(Q^{d-1})$ for fixed d and q. As $N_1 = O(Q^d)$, a contradiction is obtained for large enough Q. This shows, that $h(X) \neq 0$.

As $gh \in \mathbb{F}_2[X]$ is a non-zero polynomial and $$\text{tot} \cdot \deg(gh) = \text{tot} \cdot \deg(g) + \text{tot} \cdot \deg(h) \leq \left(1 + \frac{d}{2}(q-1)\right)(2^d - 1) - d,$$

it follows from the Schwartz-Zippel lemma that the probability that a randomly drawn point $(x_0, \ldots, x_{d-1})$ from $(\mathbb{F}_{q^2})^d$ is a non-zero of $gh$ is at least $$p := 1 - \frac{\left(1 + \frac{d}{2}(q-1)\right)(2^d - 1) - d}{q^2 - 1}.$$

For fixed d, $p > 0$ if $$L(q) := \left(\frac{1}{q-1} + \frac{d}{2}\right)(2^d - 1) < q + 1 := R(q).$$

Note that since L is monotonically decreasing with q while R is monotonically increasing with q, if $L(2^r) < R(2^r)$ for some r, then the same is true for all $r' \geq r$.

Now, for even $d \geq 4$ and $r = \log_2(d2^{d-1})$, it follows that $$L(2^r) = \left(\frac{1}{d2^{d-1} - 1} + \frac{d}{2}\right)(2^d - 1)$$

$$< \left(\frac{1}{d2^{d-1} - 1} + \frac{d}{2}\right)2^d$$

$$= \frac{2}{d - \frac{1}{2^{d-1}}} + d2^{d-1}$$

$$\leq 1 + d2^{d-1}$$

$$= R(2^r),$$

as required.

6. The Case d=4 and Additional Examples

For d=4, it follows that $l_0 = 11$, and the only integers $j \leq 2^d - 2 = 14$ with $wt_2(j) = d - 1 = 3$ are $j = 7, 11, 13, 14$, of which only 7 is $< l_0$. Hence, by definition $$\tilde{\mathcal{M}}_r = \begin{pmatrix} \alpha_{14,11}^{(r)} & \alpha_{7,11}^{(r)} \\ \alpha_{14,13}^{(r)} & \alpha_{7,13}^{(r)} \end{pmatrix}, \quad (27)$$

and $$\det(\tilde{\mathcal{M}}_r) = \alpha_{14,11}^{(r)} \alpha_{7,13}^{(r)} + \alpha_{7,11}^{(r)} \alpha_{14,13}^{(r)} \stackrel{(*)}{=} a_0\left((\alpha_{7,13}^{(r)})^3 + \alpha_{7,11}^{(r)}(\alpha_{7,14}^{(r)})^2\right),$$

recalling that $a_0 \neq 0$ is the free coefficient of $f_U/X$, where (*) follows from Lemma 5.18 by noting that by definition, $\alpha_{2i,j}^{(r)} = \alpha_{i,j}^{(r+1)}$, as $(\overline{X}^{2^r})^{2i} = (\overline{X}^{2^{r+1}})^i$. In the following examples, the simplified notation $\alpha_j$ will be used for $\alpha_{7,j}^{(r)}$. With this notation, it follows from EQ. (27) that $\det(M_r) \neq 0$ iff $\alpha_{13}^3 + \alpha_{11}\alpha_{14}^2 \neq 0$. By Proposition 5.16, this is a sufficient condition for a simple repair scheme for the $[16,12]_{\mathbb{F}_{2^r}}$ Reed-Solomon code defined on the subspace U.

Example 6.1 Consider the $\mathbb{F}_2$-linearized polynomial $f(X):=X^{16}+X^4+X \in \mathbb{F}_2[X]$. It can be verified by direct substitution that this polynomial splits in $\mathbb{F}_{2^6}$. Hence, for $q=2^3=8$, the set U of roots of $f$ in $\mathbb{F}_{q^2}$ is an $\mathbb{F}_2$-subspace. It can also be verified directly that $$(\overline{X}^8)^7 = \overline{X}^2 + \overline{X}^8 + \overline{X}^{11} + \overline{X}^{14},$$

so that with the above notation, $\alpha_{13}=0$, $\alpha_{11}\neq 0$, and $\alpha_{14}\neq 0$, and it follows that $\alpha_{13}^3 + \alpha_{11}\alpha_{14}^2 \neq 0$. Hence, Condition (**) holds, and the $[16,12]_{\mathbb{F}_{2^6}}$ Reed-Solomon code defined on U has a simple repair scheme.

Example 6.2 Consider the case $q=2^r$ with $r=4$, represent $\mathbb{F}_{q^2}=\mathbb{F}_{2^8}$ s as $\mathbb{F}_2[X]/(X^8+X^4+X^3+X^2+1)$, and let $\alpha$ be the image of X. It can be verified that $\alpha$ is a primitive element of $\mathbb{F}_{2^8}^*$. Consider the $\mathbb{F}_2$-subspace U spanned by $\{1,\alpha,\alpha^2,\alpha^3\}$ and the Reed-Solomon code C defined on U. Using any computer algebra software, it can be verified that $\alpha_{11}=\alpha^{249}$, $\alpha_{13}=\alpha^{171}$, $\alpha_{14}=\alpha^{176}$, and $\alpha_{11}\alpha_{14}^2 + \alpha_{13}^3 = \alpha^{431} \neq 0$. Hence, C has a simple repair scheme. Note that an alterative way to see this is to calculate the dimensions involved in Condition (**) directly, say, by Gaussian elimination.

C can be shortened to obtain a $[14,{}^{10}]_{\mathbb{F}_{2^8}}$ shortened Reed-Solomon code. For this shortened code, repairing any single erased coordinate requires reading, a total of only $13 \cdot 4 = 52$ bits from the remaining coordinates. Note that in the best existing repairing scheme for the $[14,{}^{10}]_{\mathbb{F}_{2^8}}$ Facebook FUNS code, repairing a single erased coordinate requires reading a total of 64 or 60 bits, depending on the erased coordinate, from the non-erased coordinates.

Example 6.3 The cases of $q=2^r$ with $r \in \{5,6,7\}$ can be considered in a similar way. The following table presents for each $r \in \{5,6,7\}$ the minimal polynomial of a primitive element $\alpha$ of $\mathbb{F}_{2^{2r}}$, as well as the relevant coefficients from the above discussion. In all cases, U is the $\mathbb{F}_2$-subspace spanned by $\{1,\alpha,\alpha^2,\alpha^3\}$. It can be seen that $\alpha_{11}\alpha_{14}^2 + \alpha_{13}^3 \neq 0$ in all cases, and hence the Reed-Solomon code defined on U has a simple repair scheme,

| r | minimal polynomial of $\alpha$ | $\alpha_{11}$ | $\alpha_{13}$ | $\alpha_{14}$ | $\alpha_{11}\alpha_{14}^2 + \alpha_{13}^3$ | parameters |
|---|---|---|---|---|---|---|
| 5 | $X^{10} + X^3 + 1$ | $\alpha^{699}$ | $\alpha^{872}$ | $\alpha^{583}$ | $\alpha^{431}$ | $[16, 12]_{\mathbb{F}_{2^{10}}}$ |
| 6 | $X^{12} + X^6 + X^4 + X + 1$ | $\alpha^{2119}$ | $\alpha^{2676}$ | $\alpha^{1516}$ | $\alpha^{2855}$ | $[16, 12]_{\mathbb{F}_{2^{12}}}$ |
| 7 | $X^{14} + X^{10} + X^6 + X + 1$ | $\alpha^{12908}$ | $\alpha^{9078}$ | $\alpha^{15325}$ | $\alpha^{11665}$ | $[16, 12]_{\mathbb{F}_{2^{14}}}$ |

Example 6.4 This example considers the case of dimension $d=6$. Let $q=2^4$, so that $q^2=2^8$, and let U be $\mathbb{F}_2$-subspace spanned by $1, \alpha, \ldots, \alpha^5$, where $\alpha$ is as in Example 6.2. Then it can be verified by direct Gaussian elimination that Condition (**) holds for $l=l_0=55$. This gives a $[64,{}^{56}]_{\mathbb{F}_{2^8}}$ Reed-Solomon code with a simple $\mathbb{F}_{2^4}$-linear repair scheme.

7. Extensions of Degree>2

While the proofs given in the previous sections consider only the case of extensions $\mathbb{F}_{2^{2r}}/\mathbb{F}_{2^r}$ of degree 2, some concrete examples below show that it is also possible to work with extensions $\mathbb{F}_{2^{mr}}/\mathbb{F}_{2^r}$ of degree m>2. In such a case, $\mathbb{F}_2$-subspaces $U \subseteq \mathbb{F}_{2^{2r}}$ of degree d divisible by m are considered. As demonstrated in examples below, it is possible in many cases to choose a subspace U as above such that an RS code of dimension k with evaluation set U has a simple $\mathbb{F}_{2^r}$-linear repair scheme, as long as $$k \leq 2^d - 2^{d-\frac{d}{m}}.$$

Recall that in such a case, if a single coordinate is erased, then each of the non-erased cc ordinates has to transmit only $1/m$ of its content to reconstruct the erased coordinate.

Example 7.1. Let the field $\mathbb{F}_{2^{12}}$ be represented as $\mathbb{F}_2[X]/(X^{12}+X^6+X^4+X+1)$, and let $\alpha$ be the image of X. Then it can be verified that $\alpha$ is a primitive element. Let $U \subseteq \mathbb{F}_{2^{12}}$ be the $\mathbb{F}_2$-span of $\{1, \alpha, \ldots, \alpha^7\}$. Then $d:=\dim(U)=8$. Consider the subfield $\mathbb{F}_{2^3}$ of $\mathbb{F}_{2^{12}}$, with $m:=[\mathbb{F}_{2^{12}}:\mathbb{F}_{2^3}]=4$. Then it can be verified by Gaussian elimination that Condition (**) holds for the RS code of dimension $$k := 2^d - 2^{d-\frac{d}{m}} = 192$$

defined on U. This gives a $[256,192]_{\mathbb{F}_{2^{12}}}$ RS code with a simple $\mathbb{F}_{2^3}$-linear repair scheme. If a single coordiante is erased, then each non-erased coordinate has to transmit only 3 bits, that is, ¼ of its content, for repairing the erased coordinate.

Example 7.2, For the field $\mathbb{F}_{2^{12}}$ represented as in the previous example, consider the subfield $\mathbb{F}_{2^4}$, for which $m:=[\mathbb{F}_{2^{12}}:\mathbb{F}_{2^4}]=3$. Let $U \subset \mathbb{F}_{2^{12}}$ be the $\mathbb{F}_2$-span of $\{1, \alpha, \ldots, \alpha^5\}$, with $d:=\dim(U)=6$. Then it can be verified by Gaussian elimination that Condition (**) holds for the RS code of dimension $$k := 2^d - 2^{d-\frac{d}{m}} = 48$$

defined on U. This gives a $[64,{}^{48}]_{\mathbb{F}_{2^{12}}}$ RS code with a simple $\mathbb{F}_{2^4}$-linear repair scheme. If a single coordiante is erased, then each non-erased coordinate has to transmit only 4 bits, that is, ⅓ of its content, for repairing the erased coordinate.

Example 7.3. Let the field $\mathbb{F}_{2^9}$ be represented as $\mathbb{F}_2[X]/(X^9+X^4+1)$, and let a he the image of X. Then it can be verified that $\alpha$ is a primitive element. Let $U \subset \mathbb{F}_{2^9}$ be the $\mathbb{F}_2$-span of $\{1, \alpha, \ldots, \alpha^5\}$. Then $d:=\dim(U)=6$. Consider the subfield $\mathbb{F}_{2^3}$ of $\mathbb{F}_{2^9}$, with extension degree m=3. Then it can be verified by Gaussian elimination that Condition (**) holds for the RS code of dimension $$k := 2^d - 2^{d-\frac{d}{m}} = 48$$

defined on U. This gives a $[64,{}^{48}]_{\mathbb{F}_{2^9}}$ RS code with a simple $\mathbb{F}_{2^3}$-linear repair scheme. If a single coordinate is erased, then each non-erased coordinate has to transmit only 3 bits, that is, ⅓ of its content, for repairing the erased coordinate.

8. Low-Bandwidth Repair Algorithm For Reed-Solomon (RS) Codes

A repair algorithm according n an embodiment of the disclosure includes two parts: an offline pre-processing part, and an online part. In the offline part, the various blocks used by the online part are prepared. In the online part, data is encoded using the RS code constructed in the offline part, and erasures are decoded if necessary.

If there is a single erasure, then, using the blocks constructed in the of part, the single erased coordinate can, be corrected with a low repair bandwidth, in that only a small, part of the content of the non-erased coordinates is transmitted to reconstruct the erased coordinate, where "small part" will be defined below.

If there are two or more erasures, then standard erasure-decoding techniques for RS codes are used, and there is no gain in repair bandwidth. However, since single erasures are much more common in practice than multiple erasures, there is it in supporting low-bandwidth repairs for the case of a single erasure.

In what follows, for a field E to be defined below, $1 := (1, \ldots, 1) \in E^{n-1}$ is the vector of n−1 ones, $0 := (0, \ldots, 0) \in E^{n-1}$ is the vector of n−1 zeros, and $(\cdot)^T$ stands for vector and matrix transposition. In addition, for a field L, a subset $I \subseteq L$, and a positive integer $k \le |I|$, the RS code with evaluation set I and dimension k is defined as the set of length-$|I|$ vectors in $L^{|I|}$ obtained by evaluating all polynomials $f \in L[X]$ of degree up to k−1 on the points of I. Explicitly, letting $I = \{x_1, \ldots, x_n\}$, with $n := |I|$, then the above RS code can be defined as $$\{(f(x_1), \ldots, f(x_n)) | f \in L[X], \deg(f) \le k-1\}.$$

In addition, a stripe according to an embodiment can have up to $$k := 2^d - 2^{d-\frac{d}{m}}$$

symbols of information, and $$2^{d-\frac{d}{m}}$$

symbols of parity, where d, m are as defined above. For example, when d=4 and m=2, there can be up to 12 symbols of information, and 4 symbols of parity.

Offline Part

The inputs of an offline part of an algorithm according to an embodiment are as follows, Integers $r \ge 1$, $m \ge 2$ defining finite fields $F := F_{2^r} \subseteq F_{2^{mr}} =: E$. Note that as an F-vector space, E is isomorphic to $F^m$.

A primitive element $\beta \in F_{2^r} = F$ and its minimal polynomial $p_1(X) \in F_2[X]$ over $F_2$, so that $\deg(p_1(X)) = r$. Let $F' := F_2[X]/(p_1(X))$, Note that $F' \cong F$, as these are two isomorphic copies of $F_{2^r}$. In addition let $\beta'$ be the image of the polynomial X in $F' := F_2[X]/(p_1(X))$, that is $\beta' := X + (p_1(X))$.

A primitive element $\alpha \in F_{2^{mr}} = E$ and its minimal polynomial $p_2(X) \in F_2[X]$ over $F_2$, so that $\deg(p_2(X)) = mr$.

A positive integer $d \le mr$, the dimension over $F_2$, divisible by m. The length n constructed codes according to embodiments is then $n := 2^d$, and their maximum possible dimension is $$k := 2^d - 2^{d-\frac{d}{m}},$$

i.e., can have up to k symbols of information, and $$2^{d-\frac{d}{m}}$$

symbols of parity, where d, m are as defined above. For example, when d=4 and m=2, there can be up to 12 symbols of information, and 4 symbols of parity.

Note that lengths $2^{d-1} < n_0 \le 2^d$ can be obtained by shortening. For simplicity, embodiments will only consider the case of $n_0 = n = 2^d$.

The outputs of an offline part of an algorithm according to an embodiment are as follows.

An $F_2$-vector subspace $V \subseteq E$ with $\dim_{F_2}(V) = d$, that is, with $|V| = 2^d = n$, which will be the evaluation set for the constructed RS code. According to an embodiment, V is given by stating its n elements, which will be enumerated for convenience as follows: $V = \{0 = u_0, u_1, \ldots, u_{n-1}\}$, where the $u_j$ are elements of E.

A "vector of projections" $v \in E^{n-1}$ whose n−1 entries will be used by the n−1 non-erased coordinates in the reconstruction process of a single erased coordinate.

A "gluing matrix" $A' \in (F')^{m \times (n-1)}$ that will be used for "gluing" individual transmissions from the n−1 non-erased coordinates.

An "embedding matrix" $M_1 \in F_2^{mr \times r}$.

An "inverse embedding matrix" $M \in F_2^{r \times mr}$.

A particular basis $B_{F/E} = \{x_1, \ldots, x_m\} \subseteq E$ for E as an F-vector space. This particular basis will be used in the final step of reconstructing a single erased coordinate.

A matrix $G_1 \in F^{k \times (n-k)}$ used for systematic encoding.

With the inputs and outputs defined as above, an offline part of an, algorithm according to an embodiment is as follows, with reference to the steps of the flowchart of FIGS. 1A-B. The flowchart starts on FIG. 1A.

Step 101: For $i=0, \ldots, d-1$, let $b_i := \alpha^i$, and let $B_{V/F_2} := \{b_0, \ldots b_{d-1}\}$.

Alternatively, according to other embodiments, $B_{V/F_2}$ can be a random set of $F_2$-independent elements in E. Such a random set, may be obtained by successively drawing d elements, until the d drawn elements are indeed linearly independent.

Step 102: Let $V = \{u_0 = 0, u_{n-1}\} \subset E$ be the $F_2$-subspace spanned by $B_{V/F_2}$.

Note that $|V| = n$, for $n = 2^d$. According to an embodiment, if the binary expansion of $i \in \{0, \ldots, 2^d - 1\}$ is $(i_0, i_1, \ldots, i_{d-1}) \in \{0,1\}^d$, so that $i = \sum_{a=0}^{d-1} i_a 2^a$, then $u_i := \sum_{a=0}^{d-1} i_a b_a$.

Step 104: For $i=1, \ldots, n-1$, set $v_i := 1/u_i$ and output $v := (v_1, \ldots, v_{n-1})$ Step 105: Define the following matrices $G \in E^{k \times n}$, $H'$, $G' \in E^{(k-1) \times (n-1)}$, and $H'' \in E^{k \times (n-1)}$, where:

$$G := \begin{pmatrix} 1 & 1 & \ldots & 1 \\ 0 & u_1 & \ldots & u_{n-1} \\ 0 & u_1^2 & \ldots & u_{n-1}^2 \\ \vdots & \vdots & \ddots & \vdots \\ 0 & u_1^{k-1} & \ldots & u_{n-1}^{k-1} \end{pmatrix} = \begin{pmatrix} 1 & 1 \\ 0^T & G' \end{pmatrix},$$

(this defines both $G$ and $G'$), $$H' := G' \cdot \begin{pmatrix} v_1 & & \\ & \ddots & \\ & & v_{n-1} \end{pmatrix},$$

and $H'' := \begin{pmatrix} v \\ H' \end{pmatrix}$.

Step 106: Calculate $\dim_F(C')$ and $\dim_F(C'')$, where $C':=\{c\in F^{n-1}|H'c^T=0\}$, the F-subfield subcode of the code with parity-check matrix H', and $C'':=\{c\in F^{n-1}|H''c^T=0\}$, the F-subfield subcode of the code with parity-check matrix H''. According to embodiments, these two dimensions can be found, e.g., by Gaussian elimination. According to an embodiment, $\dim_F(C')$ can be calculated as follows: first, replace each entry of H' by a the length-m column vector of coefficients according to some basis of E/F. This results in an $[m(k-1)]\times(n-1)$ matrix with entries in F. After performing Gaussian elimination to this last matrix, let a be the number of non-zero rows. Then $\dim_F(C')=n-1-a$.

Step 107: Check if $\delta:=\dim_F(C')-\dim_F(C'')=m$. If $\delta=m$, then continue to the next step.

Otherwise, in which case essentially $\delta<m$, then let $B_{V/F_2}$ be a new random set of $F_2$-independent elements in E, drawn independently from any previous drawing, and return to Step 102.

Step 108: Output the vector space V.

Figure 1B:
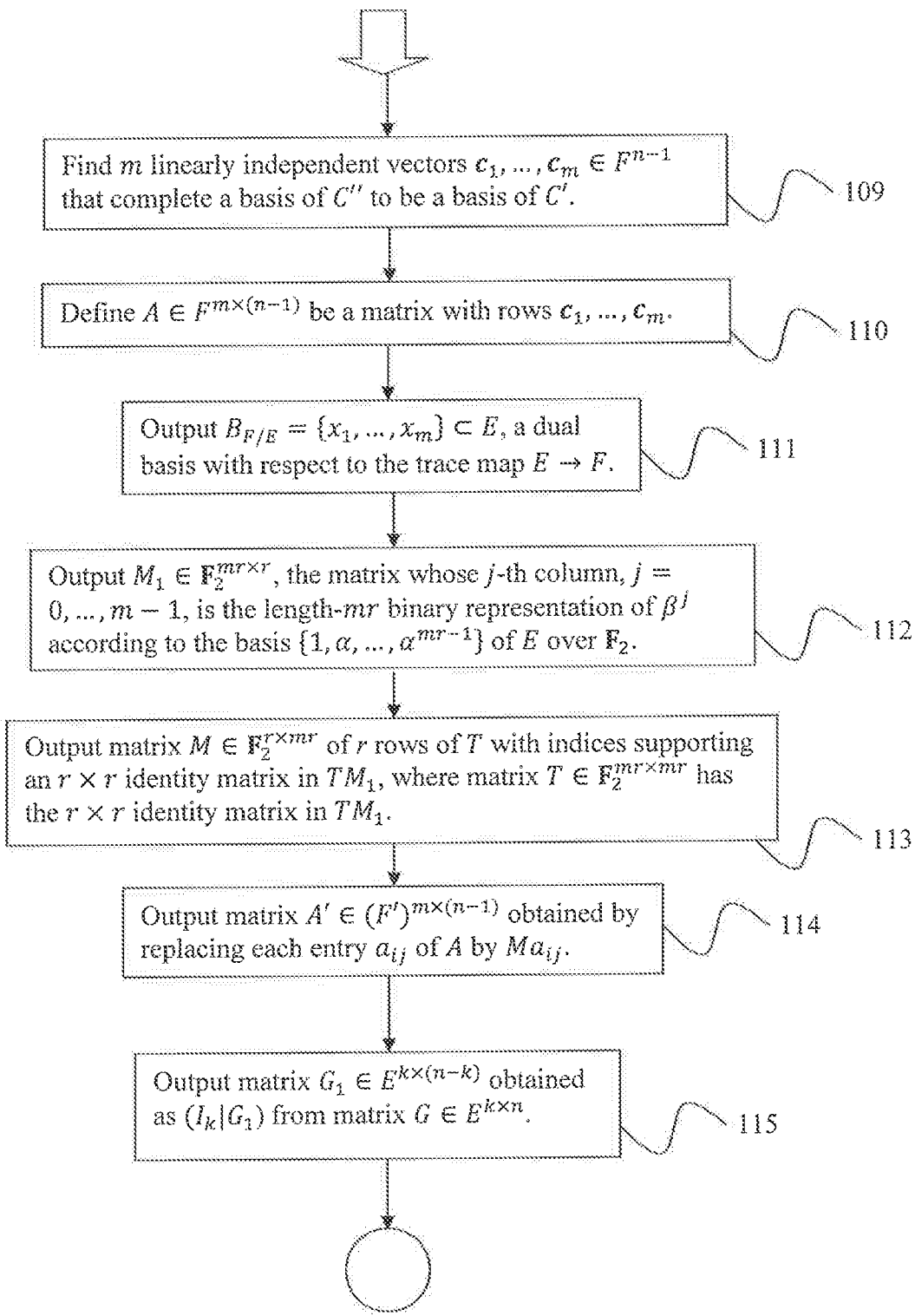

The flowchart continues on FIG. 1B.

Step 109: Find m linearly independent vectors $c_1, \ldots, c_m \in F^{n-1}$ that complete a basis, of C'' to be a basis of C'. According to an embodiment, this can be done as follows.

(1) Let $\Gamma' \in F^{\dim_F(C') \times (n-1)}$ be a generator matrix for C' of the form $\Gamma'=(I|\Gamma_1')$, where the identity matrix appears in columns $j'_1, \ldots, j'_{\dim_F(C')}$.

(2) Let $\Gamma'' \in F^{\dim_F(C'') \times (n-1)}$ be some generator matrix for C'', and let $\Gamma_1'' \in F^{\dim_F(C'') \times \dim_F(C')}$ be the matrix comprising the columns of $\Gamma''$ with indices $j'_1, \ldots, j'_{\dim_F(C')}$, where the rows of $\Gamma_1''$ are the coefficients of the rows of $\Gamma''$ with respect to the basis $\Gamma'$ for the larger code C'.

(3) After performing Gaussian elimination to $\Gamma_1''$, let $j''_1, \ldots, j''_{\dim_F(C'')} \in \{1, \ldots, \dim_F(C')\}$ be column indices for an identity matrix appearing in the resulting matrix.

(4) Let $c_1, \ldots, c_m$ be the rows of $\Gamma'$ with indices not in $\{j''_1, \ldots, j''_{\dim_F(C'')}\}$.

Step 110: Let $A \in F^{m \times (n-1)}$ be a matrix with rows $c_1, \ldots, c_m$.

At this stage, according to an embodiment, the m elements of the vector $y=(y_1, \ldots, y_m)^T := Av^T \in E^m$ are linearly independent over F, and hence constitute a basis for E over F. An offline part of an algorithm according to an embodiment continues as follows.

Step 111: Let $B_{F/E} = \{x_1, \ldots, x_m\} \subset E$ be the dual basis of $\{y_1, \ldots, y_m\}$ with respect to the trace map $E \to F$, and output $B_{F/E}$. The trace tap $Tr: E \to F$, defined above in Def. 2.1, can equivalently be defined by $u \mapsto \sum_{i=0}^{m-1} u^{|F|^i}$. For a basis $\{y_1, \ldots, y_m\}$ of E/F, the dual basis is the set $\{x_1, \ldots, x_m\}$ satisfying $$Tr(x_i y_j) = \begin{cases} 1 & \text{if } i=j \\ 0 & \text{if } i \neq j \end{cases} \text{ for all } i, j.$$

Step 112: Let $M_1 \in F_2^{mr \times r}$ be the matrix whose j-th column, $j=0, \ldots, r-1$, is the length-mr binary representation of $\beta^j$ according to the basis $\{1, \alpha, \ldots, \alpha^{mr-1}\}$ of E over $F_2$. Output $M_1$.

Step 113: Find a matrix $T \in F_2^{mr \times mr}$ such that the r×r identity matrix appears in $TM_1$.

According to an embodiment, such a matrix can be found by, e.g., Gaussian elimination. Let $M \in F_2^{r \times mr}$ be r rows of T with indices supporting an r×r identity matrix in $TM_1$. Output M.

Step 114: Let each entry of the matrix A from step 110 be a column vector in $F_2^{mr}$ according to the basis $\{1, \alpha, \ldots, \alpha^{mr-1}\}$ of E over $F_2$, and let $A' \in (F')^{m \times (n-1)}$ be the matrix obtained by replacing each entry $a_{ij}$ of A by $Ma_{ij}$, where this last column vector in $F_2^r$ is the representation of an element of F' according to the basis $\{1, \beta', \ldots, (\beta')^{r-1}\}$ of F' over $F_2$. Output A'.

Step 115: Obtain a matrix of the form $(I_k|G_1)$ from matrix $G \in E^{k \times n}$ of Step 105, where $G_1 \in E^{k \times (n-k)}$. According to an embodiment, such a matrix can be obtained by e.g., Gaussian elimination. Output $G_1$.

Online Part

According to embodiments, during online operation, incoming messages are encoded and stored in individual unreliable storage nodes. When it is found that one or more nodes have failed and its data is erased, erasure-correction algorithms are used to restore the erased data. In the common case of a single node failure, algorithms according to embodiments of the disclosure can be used. Otherwise, if more than one node fails, standard erasure-correction methods for RS codes can be used.

According to embodiments, a systematic encoding algorithm is presented, because it is the one most likely to be used in practice. Note however, that single-erasure-decoding algorithms according to other embodiments are not limited to systematic encoding, and any encoding for the code $C_{RS}$ with generator matrix $(I_k|G_1)$ may be used. For example the generator matrix G from Step 105 of FIG. 1 may be used.

i. Systematic Encoding

Inputs: Row data vector $x \in E^k$.

Output: A codeword $y \in C_{RS} \subset E^n$ corresponding to x.

Algorithm: Output $y=(y_0, \ldots, y_{n-1}):=(x|xG_1)$ where $G_1$ was obtained in an offline stage according to an embodiment.

ii. Single-Erasure Decoding

According to an embodiments, it is assumed that the entries $y_j$ of y are stored in n different storage nodes, labeled $0, \ldots, n-1$. If exactly one node $j_0$ fails, a following algorithm according to an embodiment can be used for restoring $y_{j_0}$. As indicated below, an algorithm according to an embodiment can be performed by both a controller U and each of the n-1 surviving nodes.

The inputs of an online part of a single erasure decoding algorithm according to an embodiment are the failed node index, $j_0$. It should be noted that U can learn the failed node index $j_0$, by, e.g., periodically scanning nodes and checking their status.

The outputs of an online part of a single-erasure-decoding algorithm according to an embodiment are a restored value for $y_{j_0}$ output by U. This value may then be re-stored in node $j_0$.

Each storage node can store a different vector of length n-1, call it w(i) for node i. The j-th entry of w(i) is used by node i in the process of reconstructing the $j_0$-th failed node in a predefined enumeration of all nodes but i. In such a setup, the controller can send surviving node i the index $j_0$ of the failed node, and node i then multiplies its content by $w(i)_j$ for $$j = j(i, j_0) = \begin{cases} j_0 & \text{if } j_0 < i \\ j_0 - 1 & \text{if } j_0 > i \end{cases}$$

and then takes the trace of the result, converts the result to a compact representation and transmits the compact representation to the controller. The vector $w(i) \in (F_{2^{mr}})^{n-1}$ used by node i has n-1 elements and are all different permutations of a vector v whose entries are the inverses of the non-zero elements in the evaluation set. Moreover, the w(i) are typically different for different nodes i's.

With the inputs and outputs defined as above, an online part of an algorithm according to an embodiment is as follows, with reference to the steps of the flowchart of FIG. 2.

Step 20: Identifying, by U, a failed storage node. The failed node has identifier $j_0$.

Step 21: U transmits a permutation of surviving node identifiers to all surviving nodes.

According to an embodiment, U reduces the task to an equivalent task of correcting a failed node with index 0, as follows: For all $i \neq j_0$, U calculates j' as the unique index in $\{1, \ldots, n-1\}$ such that $u_{j'} = u_{j_0} + u_i$, and sends j' to node i. Alternatively, U may just send the index $j_0$ of the erased node to each surviving node i, and node i calculates itself j' as described above.

Step 22: Each surviving node extracts the part of its content required for reconstruction, as follows: For all $i \neq j_0$, node i calculates $out_i := \text{Tr}(v_{j'} \cdot c_i) = \sum_{a=0}^{m-1} (v_{j'} \cdot c_i)^{|F|^a}$. Note that $out_i$ is in an isomorphic copy of $F_{2^r}$ inside $F_{2^{mr}}$, and therefore can be represented by r bits, instead of mr bits.

Step 23: Each surviving node i reduces the size of its content by converting $out_i$ to a r-bit representation $\widetilde{out}_i$. According to embodiments, them are several possible ways for doing this, for example:
1. If elements of $F_{2^{mr}}$ are represented as length-m vectors in $(F_{2^r})^m$ according to the basis $1, \alpha, \ldots, \alpha^{m-1}$ of $F_{2^{mr}}$ over $F_{2^r}$, then out has the form $(\gamma, 0, \ldots, 0)$ for some $\gamma \in F_{2^r}$, and node i may define $\widetilde{out}_i := \gamma$
2. If elements of $F_{2^{mr}}$ are represented as length-mr vectors of bits in $F_2^{mr}$ according to the basis $1, \alpha, \ldots, \alpha^{mr-1}$ of $F_{2^{mr}}$ over $F_2$, then $out_i$ can be regarded as a binary column vector in $F_2^{mr}$. In this case, the matrix $M \in F_2^{r \times mr}$ calculated in an offline pre-processing stage according to an embodiment may be used for obtaining $\widetilde{out}_i := M \cdot out_i$. According to an embodiment, this option will be assumed hereinafter, however, embodiments are not limited thereto.

Each surviving node i, $i \neq j_0$, then returns its extracted part $\widetilde{out}_i$ to U. Hence, each surviving node transmits only r bits instead of the total stored mr bits.

Figure 3:
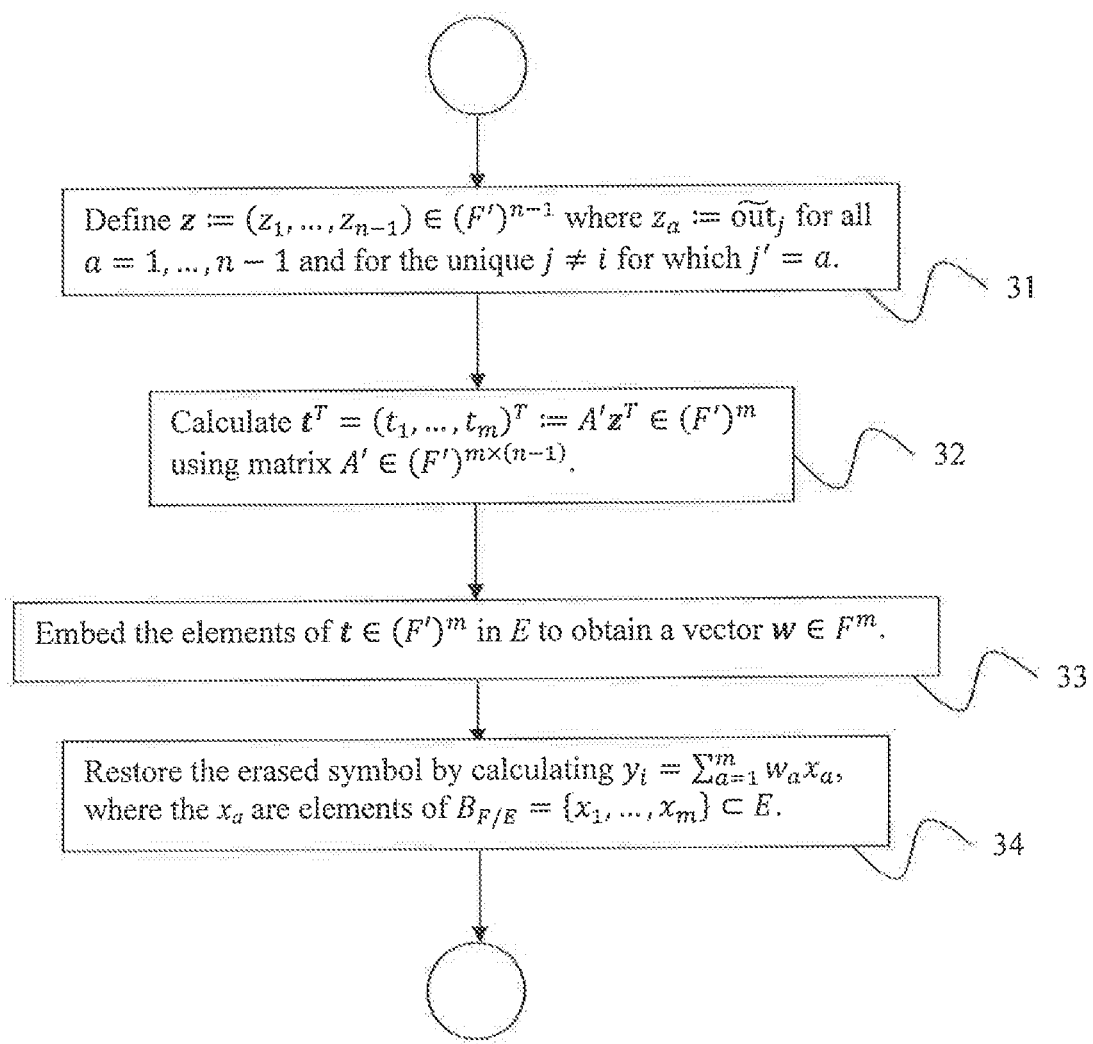
FIG. 3 is a flowchart of a method for reconstructing an erased symbol from reduced-size data, according to an embodiment of the disclosure.

Step 24: U reconstructs the erased symbol $y_{j_0}$ from the received reduced-size data, as follows, with reference to the flowchart of FIG. 3.
1. For all $a=1, \ldots, n-1$, U defines $z_a := \widetilde{out}_i$ for the unique $i \neq j_0$ for which j'=a, and defines $z := (z_1, \ldots, z_{n-1}) \in (F')^{n-1}$. Recall that j' was defined above in Step 21. (Step 31)
2. U calculates $t^T = (t_1, \ldots, t_m)^T := A' z^T \in (F')^m$ using the matrix $A' \in (F')^{m \times (n-1)}$ stored in an offline stage according to an embodiment. (Step 32)
3. U embeds the elements of $t \in (F')^m$ in E to obtain a vector $w \in F^m$. According to an embodiment, one possible way to do this is to use the matrix $M_1 \in F_2^{mr \times r}$ calculated in an offline stage according to an embodiment as follows. If each coordinate $t_a$ of t is represented as a length-r binary column vector according, to the basis $1, \beta', \ldots, (\beta')^{r-1}$ of F' over $F_2$, then U can calculate $w_a := M_1 \cdot t_a$ for $a=1, \ldots, m$ and output $w := (w_1, \ldots, w_m)$. Each entry of w is then a vector representation of an element of E, according to the basis $\{1, \alpha, \ldots, \alpha^{mr-1}\}$. (Step 33)
4. Finally, U restores the erased symbol by calculating $y_i = \sum_{a=1}^{m} w_a x_a$ (multiplication and addition of E), recalling that $B_{F/E} = \{x_1, \ldots, x_m\} \subset E$ was stored in an offline stage according to an embodiment. (Step 34)

Step 25: U outputs the reconstructed data symbol $y_i$.

Note that it is only possible to re-store the value in node $j_0$ if the failed node had a temporary failure. According to embodiments, if the node is considered lost, then the reconstructed data can be stored on a different node. According to other embodiments, the reconstructed data is not re-stored at all, but is rather re-calculated (erasure decoding) and sent to the user each time the user wishes to access the data stored on the failed node. In such a case, each time the user wishes to access the data, much more data than the required lost block has to be read from the non-failed nodes for reconstruction.

Alternatively, according to other embodiments of the disclosure, the overall action of steps 22 and 23 can be represented by an r×mr binary matrix $V_j \in F_2^{r \times mr}$ that can be pre-computed, depending on the basis of $F_2^{mr}$ over $F_2$ used for representing elements. In detail, one can pre-compute "overall" matrices $V_1, \ldots, V_{n-1} \in F_2^{r \times mr}$, and instead of the current steps 22 and 23, use a single combined step in which node j multiplies its content, regarded as a length-mr binary vector according to the above basis, by the binary matrix $V_{j'}$ to obtain the required length-r binary vector $\widetilde{out}_i$.

In other embodiments of the disclosure instead of storing the vector v and using its j'-th entry, $v_{j'}$, for the j' defined by Step 21, above, it is possible to use a different method, in which node i stores a different vector w(i), depending on i, and uses its $j=j(i,j_0)$-th entry, for $$j(i, j_0) := \begin{cases} j_0 & \text{if } j_0 < i \\ j_0 - 1 & \text{if } j_0 > i \end{cases}.$$

In an alternative embodiment, all nodes store the vector v. When node $j_0$ fails, the controller tells surviving node i, for all $i \neq j_0$: "node $j_0$ failed, calculate j' by yourself". Then, each surviving node calculates j', depending on its own index i and the failed node index $j_0$, by using the above formula, and, as before, uses $w(i)_j = v_{j'}$. In another alternative embodiment, instead of letting node i calculate j', the right permutation of v is pre-calculated and stored: its first entry is the entry that has to be used when node 0 fails, ... its (i−1)-th entry is the entry that has to be used when node i−1 fails, its i-th entry is the entry that has to be used when node i+1 fails, etc. Explicitly, define, for all $j_0 \in \{0, \ldots, i-1, i+1, \ldots, n\}$, $w(i)_{j(i,j_0)} := v_{j'}$, where $j(i,j_0)$ was defined above, and j' is as above. Note that when $j_0 = 0, \ldots, i-1, i+1, \ldots, n$, it holds that $j(i,j_0) = 0, \ldots, n-1$, as it should. There are $n = 2^d$ different vectors w(i), one for each node. These vectors are pre-computed in the offline stage, and stored in the respective n nodes, i.e., w(i) is stored on node i for all i. In some cases, this may be a favorable method, because it avoids the online permutation calculation by both the controller and the surviving nodes.

It is to be understood, however, that the above scenario, in which an algorithm according to an embodiment is performed by a controller U and of the n−1 surviving nodes, is exemplary and non-limiting, and the situation can differ in actual practice. It is possible, for example, that one node coordinates the encoding and reconstruction processes but does not actually performs them, or performs only part of the encoding/reconstruction.

For example, in Hadoop File System (HDFS), developed by the Apache Software Foundation, which is a distributed file system there is a module called HDFS RAID (RAID stands for Redundant Array of independent Disks, and is typically, related to erasure coding) that works roughly as follows. In HDFS RAID, there is a node called RaidNode that coordinates the encoding and decoding related to the erasure code, but need not actually perform them.

For encoding the RaidNode periodically scans all paths that should be erasure encoded, and selects large enough files that have not been recently modified. Once it selects a source file, it iterates over all its stipes and creates the appropriate number of parity blocks for each stripe. The actual calculation of the parity blocks may be performed locally at the RaidNode ("LocalRaidNode"), or distributed to other machines ("DistributedRaidNode"). The LocalRaidNode configuration is similar to what is described in the present disclosure.

For one case of decoding, BlockFixer, a program that runs at the RaidNode, periodically inspects the health of all relevant paths. When a file with missing or corrupt blocks is encountered, these blocks are decoded after a (parallel) read of a sufficient amount of data from the surviving nodes. Once again, the actual computation of the missing blocks may be performed either locally at the RaidNode ("LocalBlockFixer"), or distributed to one or more other machines ("DistBlockFixed"). Embodiments of the disclosure can be incorporated into the distributed case.

Note that the above decoding is a result of a periodic scan. Recall that there is also a case where the user ("client") itself finds out that there are erasures when trying to read a file. In HDFS RAID, the client implements the DRFS (Distributed RAID File System) client software, which can locally reconstruct such erased blocks, and acts as "U". In this case, the client does not re-store the reconstructed blocks: these reconstructed blocks are sent to higher layers and discarded. In this case, the client has to re-calculate the missing blocks every time the file is read.

9. System Implementations

It is to be understood that embodiments of the present disclosure can be implemented in various forms of hardware, software, firmware, special purpose processes, or a combination thereof. In one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

Figure 4:
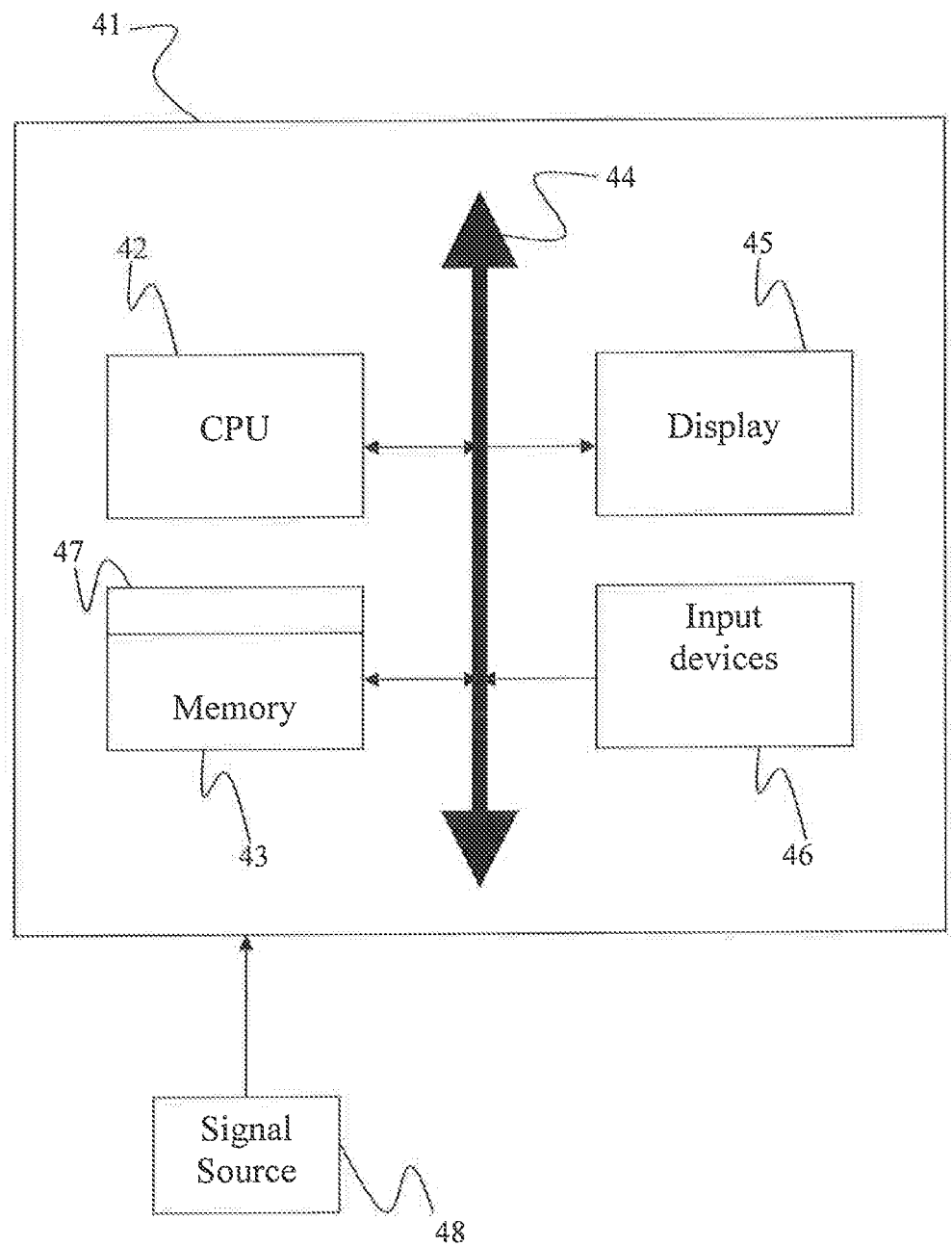
FIG. 4 is a block diagram of a system for repairing corrupted Reed-Solomon codes, according to an embodiment of the disclosure.

FIG. 4 is a block diagram of a system for repairing corrupted Reed-Solomon codes, according to an embodiment of the disclosure. Referring now to FIG. 4, a computer system 41 for implementing the present invention can comprise, inter alia, a central processing unit (CPU) or controller 42, a memory 43 and an input/output (I/O) interface 44. The computer system 41 is generally coupled through the I/O interface 44 to a display 45 and various input devices 46 such as a mouse and a keyboard. The support circuits can include circuits such as cache, power supplies, clock circuits, and a communication bus. The memory 43 can include random access memory (RAM), read only memory (ROM), disk drive, tape drive, etc., or a combinations thereof. The present disclosure can be implemented as a routine 47 that is stored in memory 43 and executed by the CPU or controller 42 to process the signal from the signal source 48. As such, the computer system 41 is a general purpose computer system that becomes a specific purpose computer system when executing the routine 47 of the present invention. Alternatively, as described above, embodiments of the present disclosure can be implemented as an ASIC or FPGA 47 that is in signal communication with the CPU or controller 42 to process the signal from the signal source 48.

The computer system 41 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

APPENDIX

A. A Calculation for the Proof of Proposition 5.10

$$\text{For } \ell_0 := \begin{cases} 2^d - 2^{d/2} - 1 & \text{if } d \text{ is even} \\ 2^d - 2^{(d+1)/2} - 1 & \text{if } d \text{ is odd} \end{cases},$$

$$A := |\{i \in \{0, \ldots, \ell_0 - 1\} \mid wt_2(i) > wt_2(\ell_0 - 1)\}|,$$

and $$B := |\{i \in \{\ell_0, \ldots, 2^d - 2\} \mid wt_2(i) \leq wt_2(\ell_0 - 1)\}|,$$

it should be shown that $$2^d - 3 - \ell_0 \geq A + B. \tag{28}$$

Suppose first that d is even. Then the binary expansion of $l_0 - 1 = 2^d - 2^{d/2} - 2$ is, with the MSB on the left:

| d − 1 | d − 2 | ... | d/2 + 1 | d/2 | d/2 − 1 | d/2 − 2 | ... | 1 | 0 |
|---|---|---|---|---|---|---|---|---|---|
| 1 | 1 | ... | 1 | 0 | 1 | 1 | ... | 1 | 0 |

In particular, $wt_2(l_0 - 1) = d - 2$.

Note that the usual ordering of the integers corresponds to the lexicographic ordering of the binary expansions. Hence an expansion represents a number $k \leq l_0 - 1$ with $wt_2(k) = d - 1$, which is the only possibility of a weight $> wt_2(l_0 - 1)$ for a number $\leq l_0 - 1$, iff the single 0 in its binary expansion is to the left of the 0 in position d/2 in the expansion of $l_0 - 1$. Hence, there are exactly $d/2 - 1$ such numbers k, so that $A = d/2 - 1$.

Similarly, a number k is strictly larger than $l_0 - 1$ iff its binary expansion has 1 in the first coordinate from the left in which it differs from the binary expansion of $l_0 - 1$. Since only numbers k with $wt_2(k) \leq wt_2(l_0 - 1)$ are of interest, $k = l_0$ is excluded, and the remaining numbers are exactly the numbers k with binary expansion of the form

| d − 1 | d − 2 | ... | d/2 + 1 | d/2 | d/2 − 1 | d/2 − 2 | ... | 0 |
|---|---|---|---|---|---|---|---|---|
| 1 | 1 | ... | 1 | 1 | ? | ? | ... | ? | where the sub-vector with question marks may be any binary vector of length d/2 and weight≤d−2−d/2=d/2−2. The total number of such vectors is B=$2^{d/2}$−d/2−1. There are now explicit expressions for both A and B, and it is straightforward to verify that EQ. (28) holds with equality.

The case where d is odd is similar: now the binary expansion of $l_0$−1 is

| d−1 | d−2 | ... | (d+1)/2+1 | (d+1)/2 | (d−1)/2 | (d−1)/2−1 | ... | 1 | 0 |
|---|---|---|---|---|---|---|---|---|---|
| 1 | 1 | ... | 1 | 0 | 1 | 1 | ... | 1 | 0 |

The numbers A and B are determined as above: there are A=(d−1)/2−1 ways to place a single zero to the left of the zero at index (d+1)/2 of the binary expansion of $l_0$−1, and there are B=$2^{(d+1)/2}$−(d+1)/2−1 binary vectors of length (d+1)/2 with weight≤d−2−(d−1)/2=(d+1)/2−2. So now the left-hand side of EQ. (28) equals $$2^d-3-(2^d-2^{(d+1)/2}-1)=2^{(d+1)/2}-2,$$

while the right-hand side equals A+B=$2^{(d+1)/2}$−3.

B. A Lemma on Substitution

Lemma B.1 For a vector T:=($T_0$, ..., $T_{d-1}$) of free variables distinct from X, let $$f(X,T):=X^{2^d}+T_{d-1}X^{2^{d-1}}+T_{d-2}X^{2^{d-2}}+\ldots+T_1X^2+T_0X\in\mathbb{F}_2[X,T].$$

Since φ(a)⊆b, the kernel of the left vertical arrow, which is surjective, is contained in the kernel of the path →↓. Hence there exists a unique dashed homomorphism making the square commutative, and this homomorphism is given by a+a↦φ(a)+b. Now the assertion of the lemma follows as a special case.

Remark B.2 Lemma B.1 is implicitly used in the main text in the following way. Instead of calculating directly the image of $(X^{2^r})^i$ uncle the right vertical arrow, which is the same as its image under the path →↓, its image under the left vertical arrow is first calculated, and then a is substituted for T, which is the action of the button horizontal arrow.

Remark B.3 In the proof of theorem 5.11 there is a use of a two-stage substitution: first, polynomials $a_i(X)\in\mathbb{F}_2[X]$ for X=($X_0$, ..., $X_{d-1}$) are substituted for the $T_i$, and then $x_0$, ..., $x_{d-1}\in\mathbb{F}_{q^2}$ are substituted for the $X_i$. This is justified by the diagram below, in which each rectangle is commutative by exactly the same argument as in the proof of Lemma B.1. In the diagram, x:=($x_0$, ..., $x_{d-1}$), a(X):=($a_0$(X), ..., $a_{d-1}$(X)), and a(x):=($a_0$(x), ..., $a_{d-1}$(x)). In addition, K is any extension field of $\mathbb{F}_2$ (e.g., K=$\mathbb{F}_{q^2}$).

$$\begin{array}{ccccc}
\mathbb{F}_2[X,T] & \xrightarrow{X\mapsto X \text{ and for all } i, T_i\mapsto a_i(X)} & K[X,X] & \xrightarrow{X\mapsto X \text{ and for all } i, X_i\mapsto x_i} & K[X] \\
\downarrow & & \downarrow & & \downarrow \\
\mathbb{F}_2[X,T] & \xrightarrow{\exists!} & K[X,X] & \xrightarrow{\exists!} & K[X] \\
(f/X) & g(X,T)+(f/X)\mapsto & (f(X,a(X))/X) & g(X,X)+(f(X,a(X))/X)\mapsto & (f(X,a(x))/X) \\
& g(X,a(X))+(f(X,a(X))/X) & & g(X,x)+(f(X,a(x))/X) &
\end{array}$$

Let K be an extension field of $\mathbb{F}_2$, let $a_0$, ..., $a_{d-1}\in K$, and write a:=($a_0$, ..., $a_{d-1}$). Then the map on the dashed arrow at the bottom of the following diagram is a well-defined homomorphism of rings, and the unique homomorphism making the diagram commutative.

$$\begin{array}{ccc}
\mathbb{F}_2[X,T] & \xrightarrow{X\mapsto X, T_0\mapsto a_0, \ldots, T_{d-1}\mapsto a_{d-1}} & K[X] \\
\downarrow & & \downarrow \\
\mathbb{F}_2[X,T]/(f/X) & \xrightarrow[g+(f/X)\mapsto g(X,a)+(f(X,a)/X)]{\exists!} & K[X]/(f(X,a)/X)
\end{array}$$

Proof. Let A and B be commutative, unital rings and let a⊆A and b⊆B be ideals. Let φ:A→B be a homomorphism with φ(a)⊆b. Consider the following diagram:

$$\begin{array}{ccc}
A & \xrightarrow{\varphi} & B \\
\downarrow & & \downarrow \\
A/a & \longrightarrow & B/b
\end{array}$$

What is claimed is:

1. A method for repairing a single erasure in a Reed-Solomon (RS) code over a finite field $F_2^{mr}$ with an evaluation set V={$u_0$=0, $u_1$, ..., $u_{n-1}$} that is a subspace of size n=$2^d$, for d<mr and divisible by m, wherein a normalized repair bandwidth $\bar{b}\approx(n-1)/m$ and a number of information symbols is k<=$2^d-2^{d-d/m}$, in a system of a plurality of n storage nodes and a controller, wherein a content $c_j$ of each storage node i is an element of the finite field $F_2^{mr}$ and each node stores a vector v whose entries are inverses of non-zero elements of the evaluation set V, the method comprising the steps of:

identifying, by the controller, a failed storage node;

transmitting, by the controller, an index $j_0$ of the failed storage node to each surviving storage node;

multiplying, by each surviving storage node i, the content $c_i$ of each said node i by a j-th component of vector w(i) wherein $$j = j(i, j_0) = \begin{cases} j_0 & \text{if } j_0 < i \\ j_0 - 1 & \text{if } j_0 > i \end{cases},$$

wherein w(i)$_{j(i,j_0)}$:=$v_{j'}$ for all i∈{0, ..., $j_0$−1,$j_0$+1, ..., n} is a permutation of elements of vector v that correspond to the surviving storage nodes, wherein j' is a unique index in (1, ..., n−1) such that $u_{j'}=u_{j_0}+u_i$;

determining a trace map of a result $out_i$ of said multiplication and converting, by each surviving storage node, the result from an m×r bit representation into a reduced representation $\widehat{out}_i$ of r bits;

reconstructing, by the controller, content of the failed storage node from the reduced representation of each surviving node's content; and outputting the reconstructed content of the failed storage node.

2. The method of claim 1, wherein j' is calculated by the controller and transmitted to the surviving storage nodes.

3. The method of claim 1, wherein each surviving storage node calculates j' based on an index of each surviving storage node and an index of the failed storage node.

4. The method of claim 1, wherein j' is pre-calculated for each storage node.

5. The method of claim 1, wherein multiplying, by each surviving storage node i, the content $c_i$ of each said node i by a j-th component of vector w(i) comprises calculating, by each node i, $i \neq j_0$, wherein $j_0$ is the identifier of the failed node, $out_i := Tr(w(i)_{j(i,j_0)} \cdot c_i) = \Sigma_{a=0}^{m-1}(w(i)_{j(i,j_0)} \cdot c_i)^{2^{ar}}$.

6. The method of claim 5, wherein converting the result from an m×r bit representation into a reduced representation of r bits comprises, when elements of field $F_{2^{mr}}$ are represented as length-m vectors in vector space $(F_{2^r})^m$ according to a basis $1, \alpha, \ldots, \alpha^{m-1}$ of $F_{2^{mr}}$ over $F_{2^r}$, and transmitting, by each node i, $i \neq j_0$, the first coordinate of $out_i$ to the controller.

7. The method of claim 5, wherein converting the result from an m×r bit representation into a reduced representation of r bits comprises, when elements of field $F_{2^{mr}}$ are represented as length-mr vectors of bits in vector space $F_2^{mr}$ according to a basis $1, \alpha, \ldots, \alpha^{mr-1}$ of $F_{2^{mr}}$ over $F_2$, wherein a is a primitive element of field $F_{2^{mr}}$, transmitting, by each node i, $i \neq j_0$, a product $M \cdot out_i$ to the controller, wherein matrix $M \in F_2^{r \times mr}$.

8. The method of claim 7, wherein matrix $M \in F_2^{r \times mr}$ is r rows of a matrix $T \in F_2^{mr \times mr}$ with indices supporting an r×r identity matrix in $TM_1$, wherein $M_1 \in F_2^{mr \times r}$ is a matrix whose j-th column, $j=0, \ldots, m-1$, is a length-mr binary representation of $\beta^j$ according to a basis $\{1, \alpha, \ldots, \alpha^{mr-L}\}$ of field E over field $F_2$, $E := F_{2^{mr}}$, and $\beta$ is a primitive element of field $F_{2^r}=F$.

9. The method of claim 1, wherein reconstructing content of the failed storage node from the reduced representation of each surviving node's content comprises:

calculating $t' := (t_1, \ldots, t_m)^T := A'z^T \in (F')^m$ using a matrix $A' \in (F')^{m \times (n-1)}$, wherein $F' := F_2[X]/(p_1(X))$, wherein $p_1(X)$ is a minimal polynomial of $\beta$, wherein vector $z := (z_1, \ldots, z_{n-1}) \in (F')^{n-1}$ wherein $z_a \widehat{out}_i$ for all $a=1, \ldots, n-1$ and for $i \neq j_0$ for which $i' = a$, wherein n is a total number of storage nodes and $\widehat{out}_i$, is the reduced representation of surviving node i's content;

wherein matrix A' is a matrix obtained by replacing each entry $a_{ij}$ of A by $Ma_{ij}$ when $a_{ij}$ is regarded as a column vector in $F_{2^{mr}}$ according a basis $\{1, \alpha, \ldots, \alpha^{mr-1}\}$ of $F_{2^{mr}}$ over $F_z$, wherein matrix $A \in F^{m \times (n-1)}$ is a matrix with rows $c_1, \ldots, c_m$ that are m linearly independent vectors $\in F^{n-1}$ that complete a basis of C" to be a basis of C', wherein $C' := \{c \in F^{n-1} | H'c^T = 0\}$, the F-subfield subcode of the code with parity-check matrix H', and $C'' := \{c \in F^{n-1} | H''c^T = 0\}$, the F-subfield subcode of the code with parity-check matrix H", wherein $H'' \in E^{k \times (n-1)} := \begin{pmatrix} v \\ H' \end{pmatrix}$, $H' \in E^{(k-1) \times (n-1)} := G' \cdot \begin{pmatrix} v_1 & & \\ & \ddots & \\ & & v_{n-1} \end{pmatrix}$, $G' \in E^{(k-1) \times (n-1)} := \begin{pmatrix} u_1 & \ldots & u_{n-1} \\ u_1^2 & \ldots & u_{n-1}^2 \\ \vdots & \ddots & \vdots \\ u_1^{k-1} & \ldots & u_{n-1}^{k-1} \end{pmatrix}$, $(v_1, \ldots, v_{n-1})$ are elements of vector v, and $(u_1, \ldots, u_{n-1})$ are non-zero elements of evaluation set V, and wherein matrix $M \in F_2^{r \times mr}$ is r rows of a matrix $T \in F_2^{mr \times mr}$ with indices supporting an r×r identity matrix in $TM_1$, wherein $M_1 \in F_2^{mr \times r}$ is a matrix whose i-th column, $j=0, \ldots, m-1$, is the length-mr binary representation of $\beta^i$ according to the basis $(1, \alpha, \ldots, \alpha^{mr-1})$ of E over $F_2$, wherein $\beta$ is a primitive element of field $F_2r=F$ and $\alpha$ is a primitive element of field $F_{2^{mr}}$;

embedding elements of $t \in (F')^m$ in field $E := F_{2^{mr}}$ to obtain a vector $w \in F^m$; and restoring the content of the failed storage node by calculating $y_i = \Sigma_{a=1}^m w_a x_z$, wherein $(x_1, \ldots, x_m) \subset E$ form a dual basis for E over F with respect to a basis whose elements are entries of vector $y = (y_1, \ldots, y_m)^T := Av^T \in E^m$.

10. The method of claim 9, wherein embedding elements of $t \in (F')^m$ in E to obtain a vector $w \in F^m$ comprises calculating $w_a := M_1 \cdot t_a$ for $a=1, \ldots, m$, wherein each coordinate $t_a$ of t is represented as a length-r binary column vector according to the basis $1, \beta', \ldots (\beta')^{r-1}$ of F' over $F_2$, and outputting $w := (w_1, \ldots, w_m)$, wherein each entry of w is a vector representation of an element of E, according to the basis $(1, \alpha, \ldots, \alpha^{mr-1})$.

11. A non-transitory program storage device readable by a computer, tangibly embodying a program of instructions executed by the computer to perform the method steps for repairing a single erasure in a Reed-Solomon (RS) code over a finite field $F_{2^{mr}}$ with an evaluation set $V = \{u_0 = 0, u_1, \ldots, u_{n-1}\}$ that is a subspace of size $n = 2^d$, for $d < mr$ and divisible by m, wherein a normalized repair bandwidth $\bar{b} \approx (n-1)/m$ and a number of information symbols is $k \leq 2^d - 2^{d-d/m}$, in a system of a plurality of n storage nodes and a controller, wherein a content $c_i$ of each storage node i is an element of the finite field $F_{2^{mr}}$ and each node stores a vector v whose entries are inverses of non-zero elements of the evaluation set V, the method comprising the steps of:

identifying, by the controller, a failed storage node;

transmitting, by the controller, an index $j_0$ of the failed storage node to each surviving storage node;

multiplying, by each surviving storage node i, the content c of each said node i by a j-th component of vector w(i) wherein $j = j(i, j_0) = \begin{cases} j_0 & \text{if } j_0 < i \\ j_0 - 1 & \text{if } j_0 > i \end{cases}$, wherein $w(i)_{j(i,j_0)} := v_{j'}$ for all $i \in \{0, \ldots, j_0-1, j_0+1, \ldots, n\}$ is a permutation of elements of vector v that correspond to the surviving storage nodes, wherein j' is a unique index in $(1, \ldots, n-1)$ such that $u_{j'} = u_{j_0} + u_i$:

determining a trace map of a result $out_i$ of said multiplication and converting, by each surviving storage node, the result from an m×r bit representation into a reduced representation $\widetilde{out}_i$ of r bits;

reconstructing, by the controller, content of the failed storage node from the reduced representation of each surviving node's content; and outputting the reconstructed content of the failed storage node.

12. The computer readable program storage device of claim 11, wherein j' is calculated by the controller and transmitted to the surviving storage nodes.

13. The computer readable program storage device of claim 11, wherein each surviving storage node calculates j' based on an index of each surviving storage node and an index of the failed storage node.

14. The computer readable program storage device of claim 11, wherein j' is pre-calculated for each storage node.

15. The computer readable program storage device of claim 11, wherein multiplying, by each surviving storage node i, the content $c_i$ of each said node i by a j-th component of vector w(i) comprises calculating, by each node i, $i \neq j_0$, wherein $j_0$ is the identifier of the failed node, $$out_i := Tr(w(i)_{j(i,j_0)} \cdot c_i) = \Sigma_{a=0}^{m-1} (w(i)_{j(i,j_0)} \cdot c_i)^{2^{ar}}.$$

16. The computer readable program storage device of claim 15, wherein converting the result from an m×r bit representation into a reduced representation of r bits comprises, when elements of field $F_{2^{mr}}$ are represented as length-mr vectors in vector space $(F_{2^r})^m$ according to a basis 1, $\alpha, \ldots, \alpha^{m-1}$ of $F_{2^{mr}}$ over $F_{2^r}$, and transmitting, by each node i, $i \neq j_0$, the first coordinate of $out_i$ to the controller.

17. The computer readable program storage device of claim 15, wherein converting the result from an m×r bit representation into a reduced representation of r bits comprises, when elements of field $F_{2^{mr}}$ are represented as length-mr vectors of bits in vector space $F_2^{mr}$ according to a basis 1, $\alpha, \ldots, \alpha^{mr-1}$ of $F_{2^{mr}}$ over $F_F$, wherein $\alpha$ is a primitive element of field $F_{2^{mr}}$, transmitting, by each node i, $i \neq j_0$, a product $M \cdot out_i$ to the controller, wherein matrix $M \in F_2^{r \times mr}$.

18. The computer readable program storage device of claim 17, wherein matrix $M \in F_2^{r \times mr}$ is r rows of a matrix $T \in F_2^{mr \times mr}$ with indices supporting an r×r identity matrix in $TM_1$, wherein $M_1 \in F_2^{mr \times r}$ is a matrix whose j-th column, $j = 0, \ldots, m-1$, is a length-mr binary representation of $\beta^j$ according to a basis $(1, \alpha, \ldots, \alpha^{mr-1})$ of field E over field $F_2 E := F_{2^{mr}}$, and $\beta$ is a primitive element of field $F_{2^r} = F$.

19. The computer readable program storage device of claim 11, wherein reconstructing content of the failed storage node from the reduced representation of each surviving node's content comprises:

calculating $t^T = (t_1, \ldots, t_m)^T := A'z^T \in (F')^m$ using a matrix $A' \in (F')^{m \times (n-1)}$, wherein $F' := F_2[X]/f(p_1(X))$, wherein $p_1(X)$ is a minimal polynomial of $\beta$, wherein vector $z := (z_1, \ldots, z_{n-1}) \in (F')^{n-1}$ wherein $z_a := \widetilde{out}_i$ for all $n=1, \ldots, n-1$ and for $I \neq j_0$ for which $j' = \alpha$, wherein n is a total number of storage nodes and $\widetilde{out}_i$ is the reduced representation of surviving node i's content;

wherein matrix A' is a matrix obtained by replacing each entry $a_{ij}$ of A by $Ma_{ij}$ when $a_{ij}$ is regarded as a column vector in $F_2^{mr}$ according a basis $\{1, \alpha, \ldots \alpha^{mr-1}\}$ of $F_{2^{mr}}$ over $F_2$, wherein matrix $A \in F^{m \times n-1)}$ is a matrix with rows $c_1, \ldots, c_m$ that are m linearly independent vectors $\in F^{n-1}$ that complete a basis of C'' to be a basis of C', wherein $C' := \{c \in F^{n-1} | H'c^T = 0\}$, the F-subfield subcode of the code with parity-check matrix H', and $C'' := \{c \in F^{n-1} | H''c^T = 0\}$, the F-subfield subcode of the code with parity-check matrix H'', wherein $$H'' \in E^{k \times (n-1)} := \begin{pmatrix} v \\ H' \end{pmatrix},$$

$$H' \in E^{(k-1) \times (n-1)} := G' \cdot \begin{pmatrix} v_1 & & \\ & \ddots & \\ & & v_{n-1} \end{pmatrix},$$

$$G' \in E^{(k-1) \times (n-1)} := \begin{pmatrix} u_1 & \ldots & u_{n-1} \\ u_1^2 & \ldots & u_{n-1}^2 \\ \vdots & \ddots & \vdots \\ u_1^{k-1} & \ldots & u_{n-1}^{k-1} \end{pmatrix},$$

$(v_1, \ldots, v_{n-1})$ are elements of vector v, and $(u_1, \ldots, u_{n-1})$ are non-zero elements of evaluation set V, and wherein matrix $M \in F_2^{r \times mr}$ is r rows of a matrix $T \in F_2^{mr \times mr}$ with indices supporting an r×r identity matrix in $TM_1$, wherein $M_1 \in F_2^{mr \times r}$ is a matrix whose j-th column, $j=0, \ldots, m-1$, is the length-mr binary representation of $\beta^j$ according to the basis $(1, \alpha, \ldots, \alpha^{mr-1})$ of E over $F_2$, wherein $\beta$ is a primitive element of field $F_{2^r} = F$ and $\alpha$ is a primitive element of field $F_{2^{mr}}$;

embedding elements of $t \in (F')^m$ in field $E := F_{2^{mr}}$ to obtain a vector $w \in F^m$; and restoring the content of the failed storage node by calculating $y_i = y_i = \Sigma_{a=1}^{m} w_a x_a$, wherein $(x_1, \ldots, x_m) \subset E$ form a dual basis for E over F with respect to a basis whose elements are entries of vector $y = (y_1, \ldots, y_m)^T := Av^T \in E^m$.

20. The computer readable program storage device of claim 19, wherein embedding elements of $t \in (F')^m$ in E to obtain a vector $w \in F^m$ comprises calculating $w_a := M_1 \cdot t_a$ for $a=1, \ldots, m$, wherein each coordinate $t_a$ of t is represented as a length-r binary column vector according to the basis $1, \beta', \ldots, (\beta')^{r-1}$ of F' over $F_2$, and outputting $w := (w_1, \ldots, w_m)$, wherein each entry of w is a vector representation of an element of E, according to the basis $(1, \alpha, \ldots, \alpha^{mr-1})$.

* * * * *